(12) United States Patent
Anderson et al.

(10) Patent No.: US 7,309,653 B2
(45) Date of Patent: Dec. 18, 2007

(54) METHOD OF FORMING DAMASCENE FILAMENT WIRES AND THE STRUCTURE SO FORMED

(75) Inventors: Brent A. Anderson, Jericho, VT (US); Andres Bryant, Burlington, VT (US); Jeffrey P. Gambino, Westford, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,552

(22) Filed: Feb. 24, 2005

(65) Prior Publication Data

US 2006/0189137 A1 Aug. 24, 2006

(51) Int. Cl.
*H01L 21/02* (2006.01)

(52) U.S. Cl. .................. 438/691; 438/692; 257/758

(58) Field of Classification Search ............... 438/691, 438/692; 257/758
See application file for complete search history.

(56) References Cited

U.S. PATENT DOCUMENTS

| 2004/0061229 A1* | 4/2004 | Moslehi ............... 257/758 |
| 2005/0064701 A1* | 3/2005 | Dalton et al. ............ 438/627 |
| 2006/0030128 A1* | 2/2006 | Bu et al. ................ 438/462 |

* cited by examiner

*Primary Examiner*—Nadine G. Norton
*Assistant Examiner*—Mahmoud Dahimene
(74) *Attorney, Agent, or Firm*—Schmeiser, Olsen & Watts; Anthony J. Canale

(57) ABSTRACT

A method of forming a semiconductor device, and the device so formed. Depositing a low dielectric constant material on a substrate. Depositing a hard mask on the low dielectric constant material. Forming an at least one first feature within the low dielectric constant material and the hard mask. Depositing a conformal liner over the hard mask and within the at least one feature, wherein the liner occupies more than at least 2% of a volume of the at least one feature, and wherein a thickness of the liner is at least approximately ⅓ a minimum width of the at least one feature. Metallizing the at least one feature.

18 Claims, 27 Drawing Sheets

METHOD OF FORMING DAMASCENE FILAMENT WIRES AND THE STRUCTURE SO FORMED

BACKGROUND OF THE INVENTION

1. Technical Field

The present invention relates generally to semiconductor devices, and more particularly, to a method of forming low capacitance back end of the line (BEOL) wiring, and the structure so formed.

2. Related Art

When forming CMOS, BiCMOS, SiGe, and other similar devices, it is desirable to minimize capacitance. Likewise, there is a continuing desire in the industry to reduce device size. Therefore, there is a need in the industry for a method of forming a semiconductor device that addresses these and other issues.

SUMMARY OF THE INVENTION

The present invention provides a method of forming a semiconductor device having a low wire capacitance and a high wire resistance, and the structure so formed, that solves the above-stated and other problems. The device comprises conductive wires having widths substantially smaller than the width of the printed and etched trench and/or via formed for the wire.

A first aspect of the invention provides a method of forming a semiconductor device, comprising: providing a substrate; depositing a first dielectric layer; depositing a hard mask on the first dielectric layer; forming an at least one first feature within the first dielectric layer and the hard mask; depositing a conformal dielectric liner over the hard mask and within the at least one feature, wherein the liner occupies more than at least 2% of a volume of the at least one feature; depositing a conductive material over the liner; and planarizing a surface of the device to remove excess conductive material.

A second aspect of the invention provides a method of forming a semiconductor device, comprising: providing a substrate; depositing a first dielectric layer; forming an at least one feature within the first dielectric layer; depositing a conformal dielectric liner over a surface of the device and within the at least one feature, wherein a thickness of the liner is at least approximately ⅓ a minimum width of the at least one feature; and metallizing the at least one feature.

A third aspect of the invention provides a semiconductor device, comprising: a substrate; a first dielectric layer on a surface of the substrate; a hard mask on the first dielectric layer; at least one first feature within the first dielectric layer and the hard mask; a conformal dielectric liner over the hard mask and within the at least one feature, wherein the liner occupies more than at least 2% of a volume of the at least one feature; and a conductive material within the at least one feature.

A fourth aspect of the present invention provides a method of forming a structure, and the structure so formed, comprising a dual damascene structure wherein a via of the dual damascene features may be formed having a width equal to, or up to ⅓ less than, a minimum trench width, and wherein a thickness of a conformal dielectric liner within the feature occupies more than at least approximately 2% of the feature volume.

The foregoing and other features and advantages of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications might be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
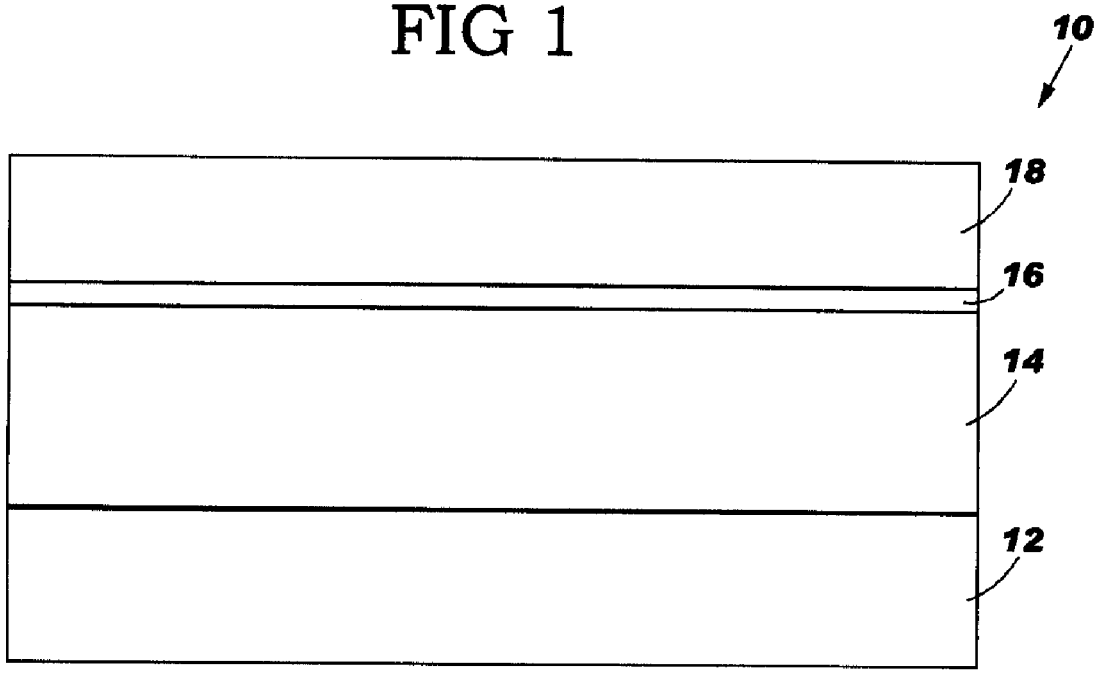
FIG. 1 depicts a cross-sectional view of a device comprising a first dielectric layer, a first hard mask and a photoresist layer thereon, in accordance with embodiments of the present invention.

FIG. 1 depicts a semiconductor device 10 having a substrate 12, which may comprise conventional features (not shown), such as, a plurality of shallow trench isolations (STI), a MOS transistor and spacers, a vertical NPN transistor, a plurality of contacts damascened into a dielectric, etc., as is known in the art. The substrate 12 is preferably substantially planar, as shown in FIG. 1.

In accordance with the present invention, a first dielectric layer 14 is deposited over a surface of the substrate 12. The first dielectric layer 14 may comprise a dielectric material having a low dielectric constant (k), wherein "low k" is defined as a dielectric constant (k) below 3.0, or in the range of approximately 1.5-2.7, such as porous poly(areylene) ether (e.g., porous SiLK™ (Dow Chemical)), porous SiCOH, porous $SiO_2$, teflon, amorphous carbon, etc. The first dielectric layer 14 may be deposited using chemical vapor deposition (CVD), plasma enhanced chemical vapor deposition (PECVD), spin-on deposition, etc., to a thickness of approximately 150-200 nm.

A hard mask 16 is then deposited over the first dielectric layer 14. The hard mask 16 may comprise a dielectric material, such as SiC, SiCN, SiCOH, $SiO_2$, $Si_3N_4$, etc. The hard mask 16 may be deposited using CVD, PECVD, etc., to a thickness of approximately 1-100 nm, e.g., 10 nm. The hard mask 16 protects the first dielectric layer 14 during subsequent processing, and is optional.

Figure 2:
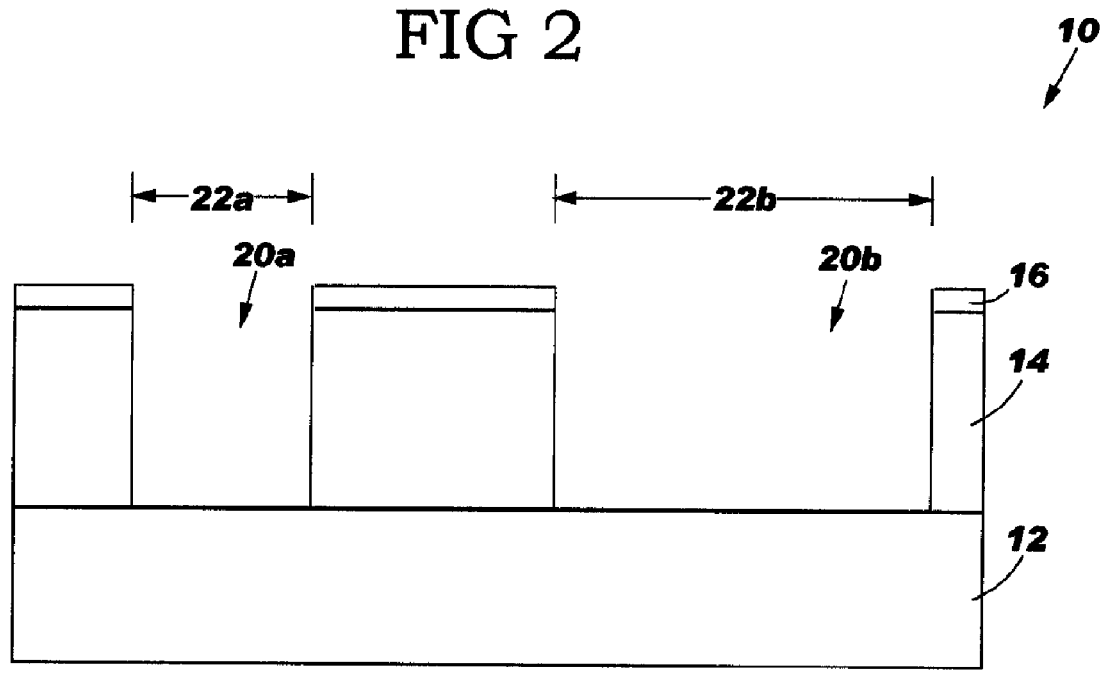
FIG. 2 depicts the device of FIG. 1 having trenches formed therein.

A photoresist 18 is then applied over the hard mask 16, as illustrated in FIG. 1. The photoresist 18 may be applied to a thickness in the range of approximately 50-3000 nm, e.g., 200 nm. The photoresist 18 may comprise a positive or negative photoresist 18 as desired. The photoresist 18 is patterned, and the first dielectric layer 14 and hard mask 16 are etched using standard back end of the line (BEOL) exposure and reactive ion etch (RIE) formation techniques to form trenches 20a, 20b (FIG. 2). Narrower trenches 20a may be formed having an aspect ratio (height:width) in the range of approximately 2:1, and a minimum trench width 22a in the range of approximately 100-150 nm. Wider trenches 20b may be formed having any width, and a wide range of aspect ratios, e.g., an aspect ratio of approximately 1:2, 1:10, etc. The wider trenches 20b may also be formed with an optional "dummy fill" in the very large trenches 20b (e.g., a width greater than 2 microns) to reduce the patterned factor, as known in the art.

During the standard BEOL formation process the photoresist 18 may be completely consumed during the RIE etch used in conjunction with a p-SiLK first dielectric layer 14, as illustrated in FIG. 2. Alternatively, a multi-layer hard mask may be used (not shown), such as a first lower hard mask layer, (SiC), and a second upper hard mask layer, ($SiO_2$). When using the multi-layer hard mask set the $SiO_2$ is patterned and etched down to the SiC. The photoresist used to pattern the $SiO_2$ is removed. The $SiO_2$ is then used to pattern and etch the SiC. The remaining combination of $SiO_2$ and SiC are then used to pattern the underlying first dielectric layer 14, as known in the art.

Figure 3:
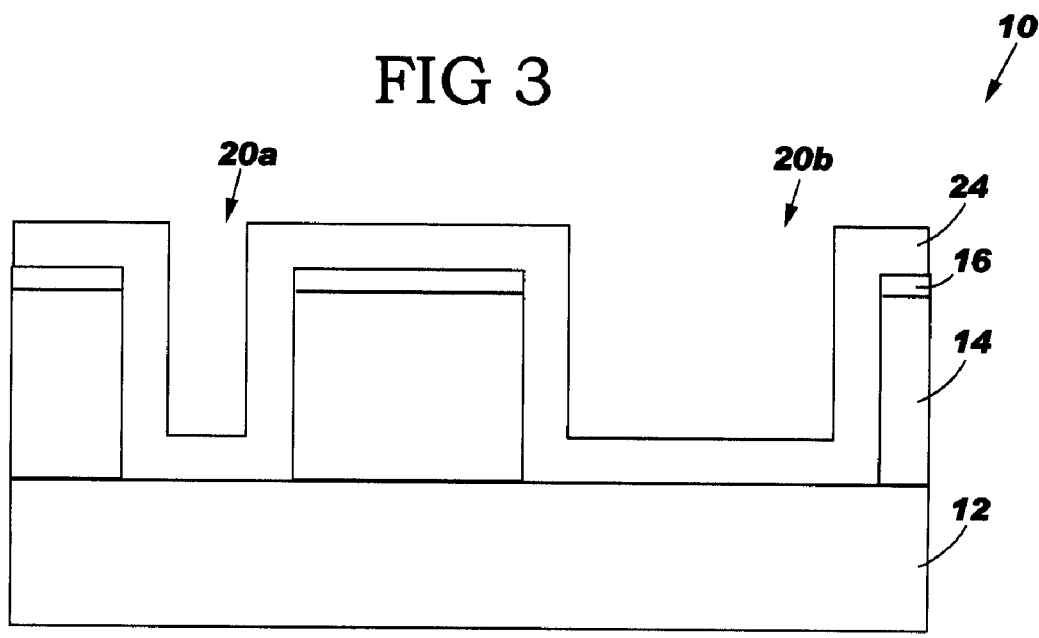
FIG. 3 depicts the device of FIG. 2 having a conformal liner thereon.

As illustrated in FIG. 3, a conformal dielectric liner 24 is deposited over the surface of the device 10. The liner 24 may comprise a dielectric material having a low dielectric constant (k), wherein "low k" is defined as a dielectric constant (k) preferably below 3.0, or in the range of approximately 1.4-4.5, such as SiCOH, $SiO_2$, poly(areylene) ether (e.g., SiLK™ (Dow Chemical)), teflon, or other similarly used material. The liner 24 may be deposited using PECVD, CVD, or other similar deposition techniques. The liner 24 may have a thickness up to approximately ½ the width of the minimum trench width 22a, and preferably ⅓ the width of the minimum trench width 22a (FIG. 2: 100-200 nm), i.e., a thickness in the range of approximately 30-50 nm. As a result, the liner 24 occupies more than at least 2% of a trench volume, e.g., at least 50%, or more, of the trench volume. The liner 24 must be prevented from "pinching off" (filling in the opening of the trenches 20a, 20b) which would prevent subsequent metallization of the trenches 20a, 20b.

Figure 4:
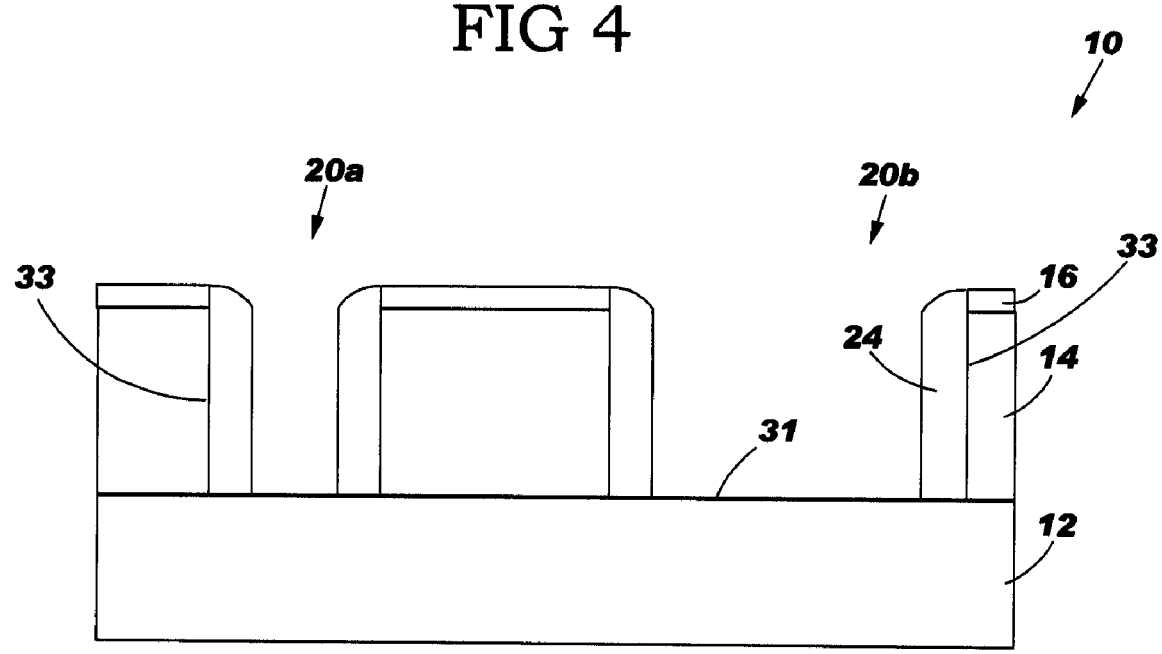
FIG. 4 depicts the device of FIG. 3 following an etch back process.

A spacer etch back process is performed to remove a portion of the liner 24 from a base 31 of the trenches 20a, 20b, while leaving the liner 24 on the sidewalls 33 of the trenches 20a, 20b, as illustrated in FIG. 4.

Figure 5:
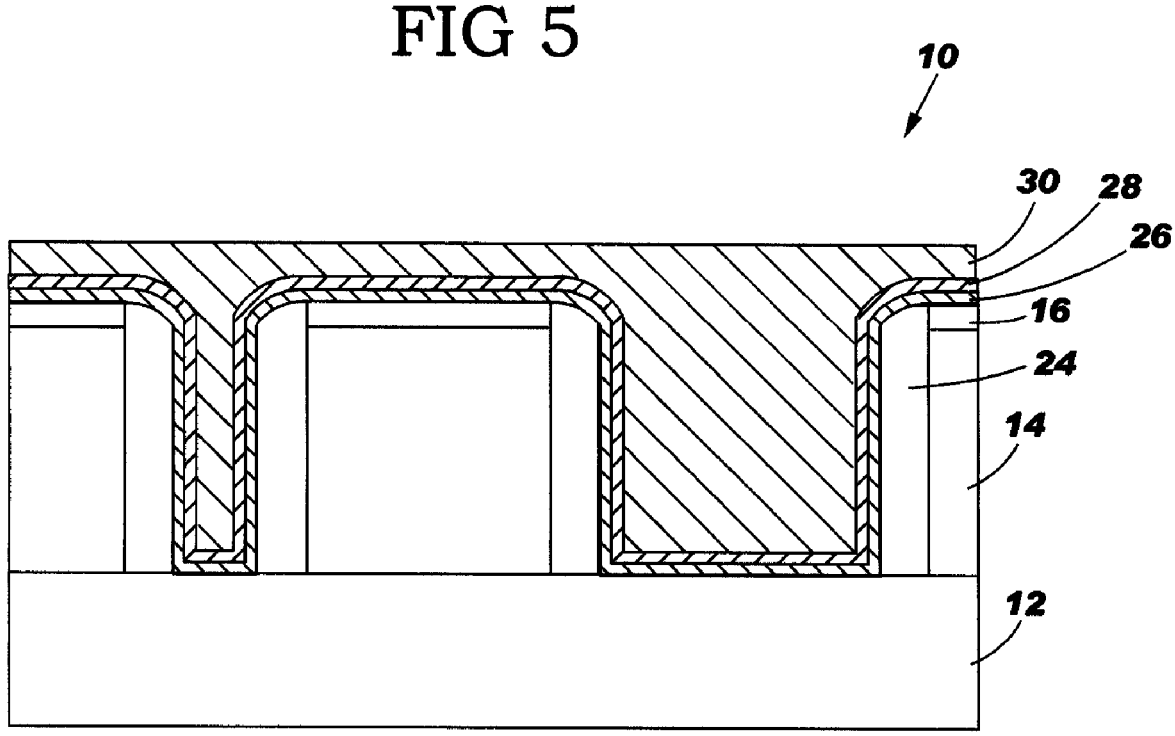
FIG. 5 depicts the device of FIG. 4 following metallization.

As illustrated in FIG. 5, a conductive liner 26, a seed layer 28 and a conductive layer 30 are deposited during a standard metallization process. The conductive liner 26 may be deposited over the surface of the device 10 using sputtering techniques, such as plasma vapor deposition (PVD), ionized plasma vapor deposition (IPVD), self-ionized plasma (SIP), HCM, chemical vapor deposition (CVD), atomic layer deposition (ALD), metal organic chemical vapor deposition (MOCVD), etc. Likewise, the seed layer 28 may be deposited over the conductive liner 26 using similar sputtering techniques, i.e., PVD, IPVD, SIP, HCM, CVD, ALD, MOCVD, etc. The conductive liner 26 may comprise one or more refractory metals or alloys, such as Ta, TaN, TiN, W, WN, TaSiN, WSiN, or other similarly used material. The conductive liner 26 may have a thickness in the range of approximately 1-200 nm, e.g., 5 nm. The seed layer 28 may comprise a copper seed material, or other similarly used material for the subsequent electroplating deposition. The seed layer 28 may have a thickness in the range of approximately 1-200 nm, e.g., 20 nm. The conductive layer 30 may comprise copper, or other similarly used material. The conductive layer 30 may be formed having a thickness in the range of approximately 50 nm-5 microns, e.g., 200 nm. It should be noted that the conductive liner 26 and the seed layer 28 are not drawn to scale for purposes of illustration.

Figure 6:
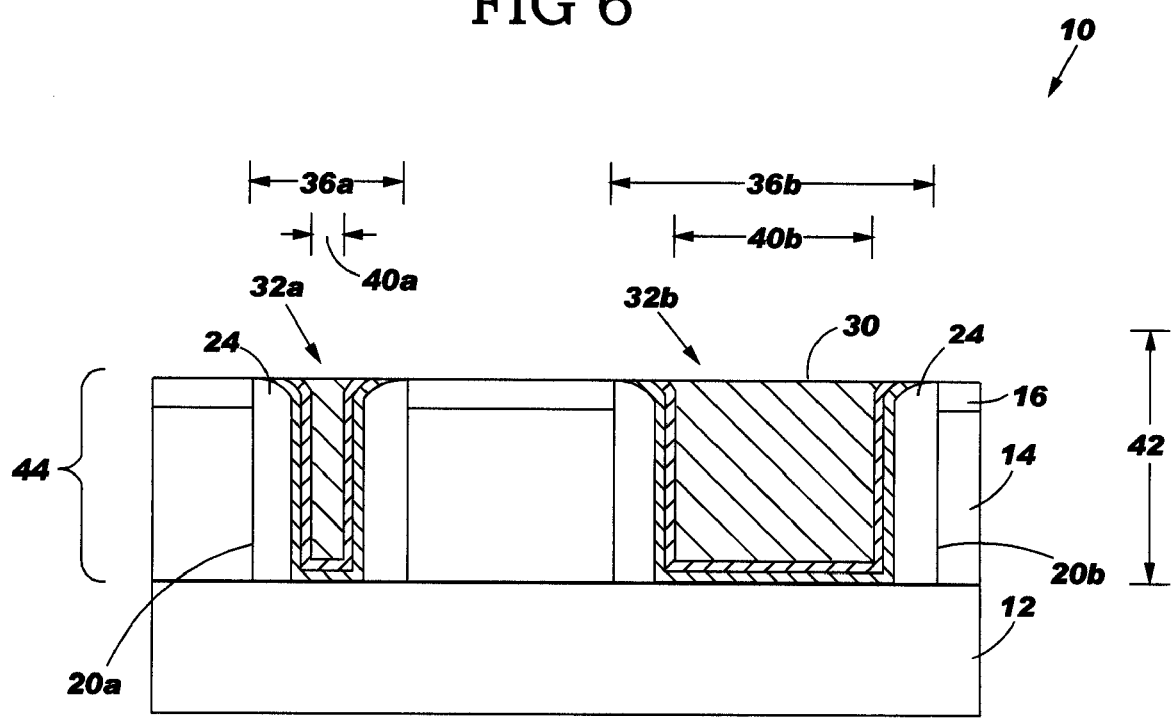
FIG. 6 depicts the device of FIG. 5 following planarization.

Following deposition of the metallization, (the conductive liner 26, the seed layer 28 and the conductive layer 30), a planarization process is performed to remove the excess metallization on the surface of the device 10. A chemical mechanical polish (CMP) or other similarly used process may be used to planarize the surface of the device 10. The planarization process is performed down to the conformal dielectric liner 24, as illustrated in FIG. 6. Alternatively, the planarization process may be performed down to the hard mask 16 (not shown). A first metal wiring level 44, having a plurality of electrically conductive wires 32a, 32b therein, in this example comprising a single damascene wiring structure, is produced following the planarization process.

As illustrated in Table 1, infra, the present invention produces a device 10 having a capacitance far lower, and a wire resistance much higher, than that of similar devices formed using conventional formation methods.

TABLE 1

Comparison of Capacitance and wire Resistance measurements normalized to the Conventional Device A

| BEOL device dielectric layer 14 liner 24 (wire dimensions) (aspect ratio) | Resistance per micron | Line-to-Line Capacitance per micron | Capacitance between wiring levels per micron |
|---|---|---|---|
| Conventional Device | | | |
| A. SiCO (k = 2.7) (140 nm × 200 nm) (1.4:1) | 1 | 1 | 1 |
| Present Invention | | | |
| B. p-silk (k = 2.2) SiCOH liner (k = 2.7) (50 nm × 150 nm) (3:1) | 5 | 0.4 | 0.7 |
| C. p-OSG (k = 1.6) SiCOH liner (k = 2.7) (50 nm × 150 nm) (3:1) | 5 | 0.3 | 0.5 |
| D. p-OSG (k = 1.6) SiCOH liner (k = 2.7) (25 nm × 75 nm) (3:1) | 20 | 0.15 | 0.3 |

(* The "p-" indicates that the dielectric is a porous dielectric. The "k" stands for dielectric constant.)

As illustrated by examples B-D under the "Present Invention" in Table 1, using a low k dielectric material for the first dielectric layer 14, in conjunction with a low k dielectric liner 24 reduces the overall capacitance of the device 10 and increases the wire resistance. In fact, the lower the dielectric constant (k) of the first dielectric layer 14 the more the capacitance of the device is reduced (compare example B with examples C and D) and the more the wire resistance is increased.

As illustrated in FIG. 6, the wires 32a, 32b have a far smaller width 40a, 40b as compared to the trench widths 36a, 36b, respectively, made available for wiring during patterning and etching. In fact, the wires 32a, 32b have a width 40a, 40b in the range of approximately ⅓-⅔ the widths 36a, 36b of the trenches 20a, 20b, respectively. Typically this would be considered undesirable because it tends to increase wire resistance. The present invention, however, is not concerned with wire resistance, and may be used in conjunction with devices that are not affected by wire resistance, such as ultra low power CMOS devices, wherein the power consumption is determined primarily by the transistor driver resistance and the wire capacitance. By reducing the size (e.g., height 42 and width 40a, 40b) of the wires 32a, 32b, the capacitance of the device 10 can be reduced even further, (compare examples C and D of Table 1). Therefore, it is possible in the present invention to pattern and etch the trenches 20a, 20b having an aspect ratio of 2:1, but end up with much narrower conductive wires 32a, 32b within the trenches 20a, 20b having an aspect ratio of 5:1.

Figure 7:
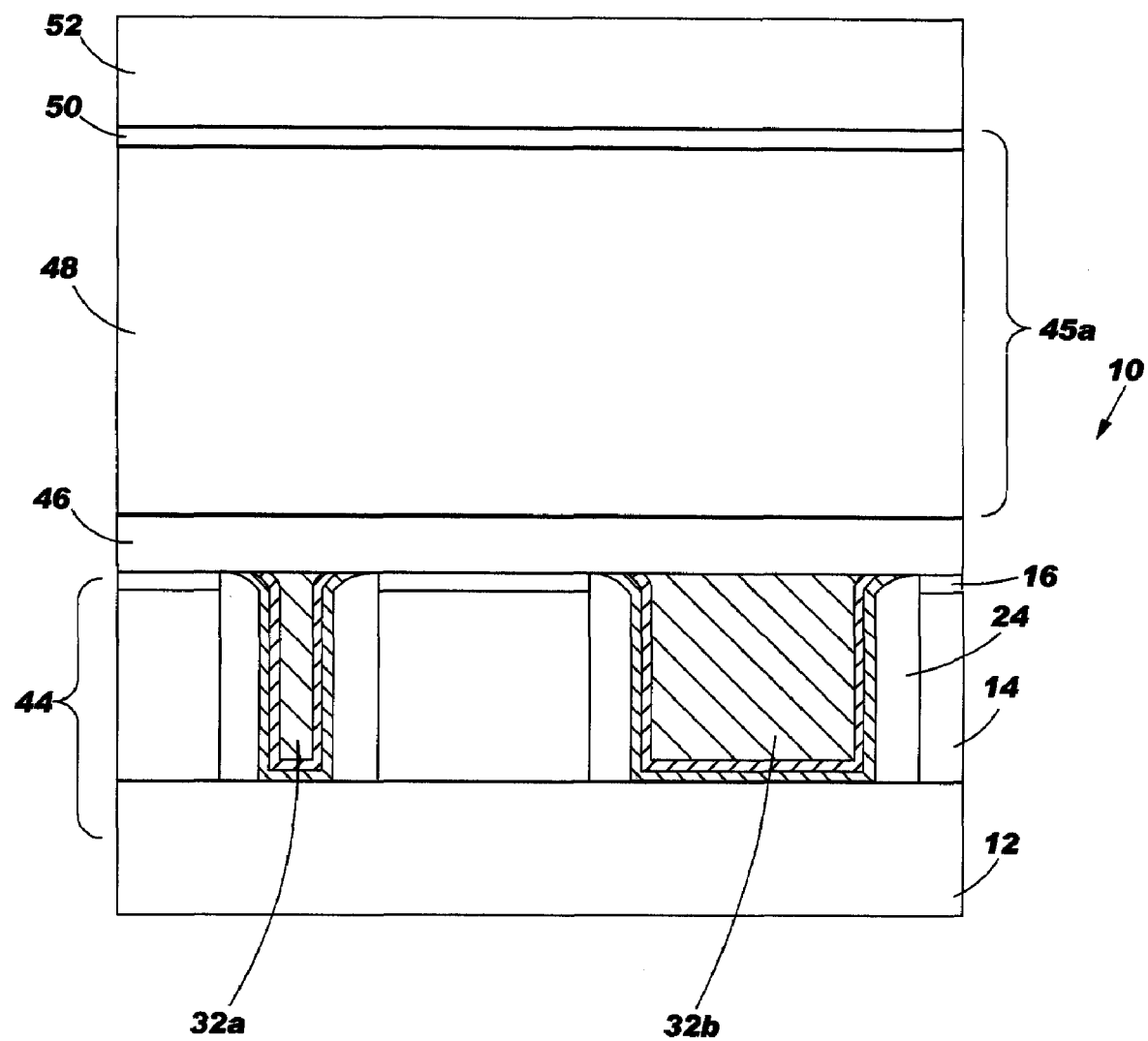
FIG. 7 depicts the device of FIG. 6 having a second dielectric layer, hardmask and photoresist layer.

A dual damascene structure may also be formed in accordance with the present invention. As illustrated in FIG. 7, a second wiring level 45a may be formed on the first wiring level 44, in this example comprising a dual damascene wiring structure. First, a capping layer 46 is deposited over the first metal wiring level 44. The capping layer 46 may comprise SiCN, or other similarly used material. The capping layer 46 may be deposited using CVD, PECVD, etc., having a thickness in the range of approximately 5-100 nm, e.g., 20 nm. The purpose of the capping layer 46 is to prevent diffusion of copper from the conductive wire 32a, 32b formed in the first wiring level 44 into the dielectric layer 48 in the second wiring level 45a. The capping layer 46 may also optionally be used as an etch stop layer during patterning and etching of the vias in the second wiring level 45. Alternatively, the capping layer 46 could be replaced (not shown) by a selective conductive cap, such as electroless plated COWP; a damascene conductor, such as Ta; a dielectric, such as SiCN; or a substantially etched dielectric layer, as known in the art.

A second dielectric layer 48 is deposited over the capping layer 46. The second dielectric layer 48 may comprise a dielectric material having a low dielectric constant (k), wherein "low k" is defined as a dielectric constant (k) below 3.0, or in the range of approximately 1.5-2.7, such as porous poly(areylene) ether (e.g., porous SiLK™ (Dow Chemical)), porous SiCOH, porous SiO$_2$, teflon, amorphous carbon, etc. The second dielectric layer 48 may be deposited using CVD, PECVD, spin-on deposition, etc., to a thickness of approximately 100-3000 nm, e.g., 400 nm.

A hard mask 50 is then deposited over the second dielectric layer 48. The hard mask 50 may comprise a dielectric material, such as SiC, SiCN, SiCOH, SiO$_2$, Si$_3$N$_4$, etc. The hard mask 50 may be deposited using CVD, PECVD, etc., to a thickness of approximately 1-100 nm, e.g., 10 nm.

Figure 8:
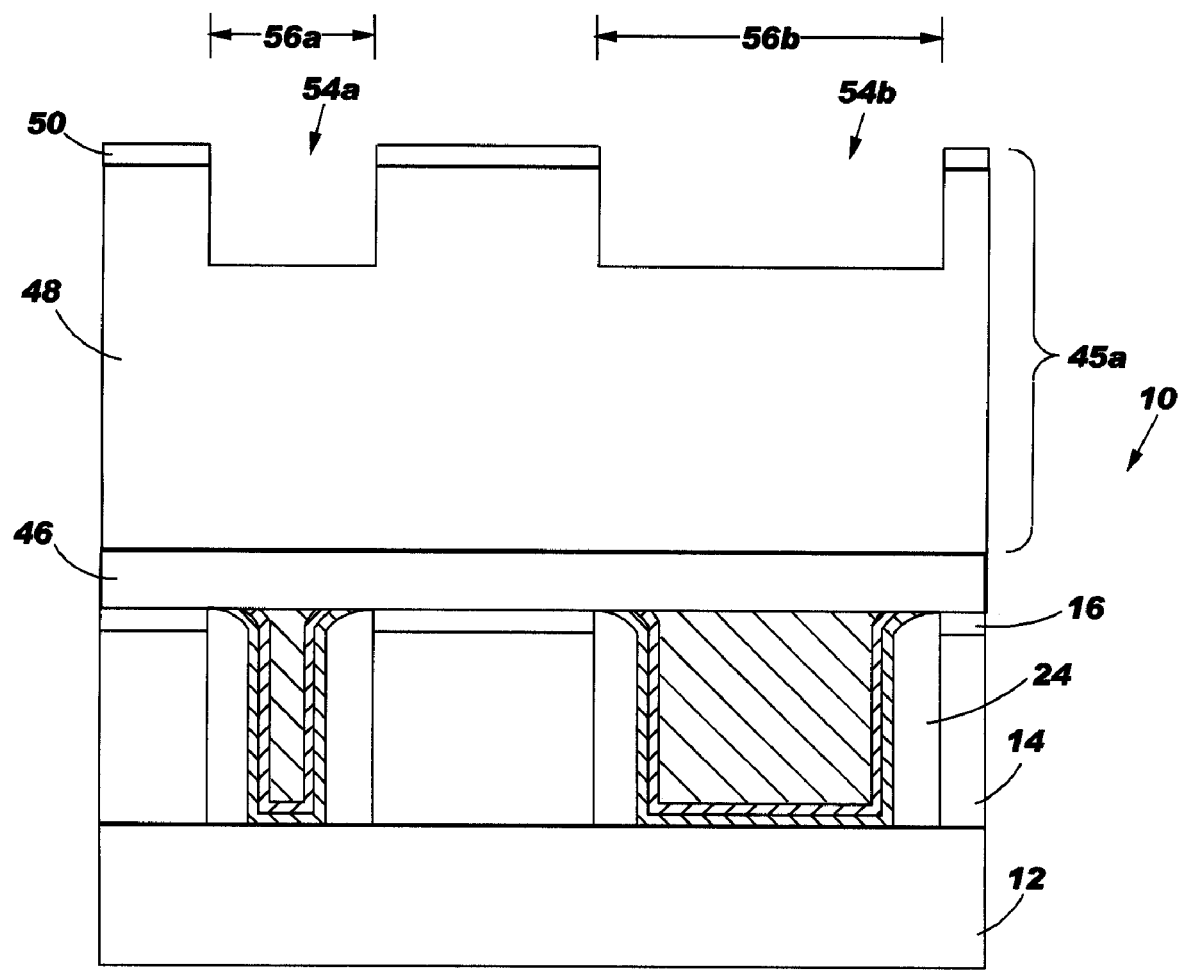
FIG. 8 depicts the device of FIG. 7 having a plurality of trenches formed therein.

A photoresist 52 is then applied over the hard mask 50, as illustrated in FIG. 7. The photoresist 52 may be applied to a thickness in the range of approximately 50-3000 nm, e.g., 200 nm. The photoresist 52 may comprise a positive or negative photoresist 52 as desired. The photoresist 52 is then patterned and etched using standard BEOL exposure and RIE formation techniques to form trenches 54a, 54b (FIG. 8). Narrower trenches 54a may be formed having an aspect ratio of approximately 2:1, and a minimum trench width 56a in the range of approximately 100-150 nm. Wider trenches 54b may be formed having any width, and a wide range of aspect ratios, e.g., an aspect ratio of approximately 1:2, 1:10, etc. As described supra, the photoresist 52 may be completely consumed during the standard BEOL formation processing when used in conjunction with a p-SiLK second dielectric layer 48. Alternatively, a multi-layer hard mask may be used (not shown), as described supra.

Figure 9:
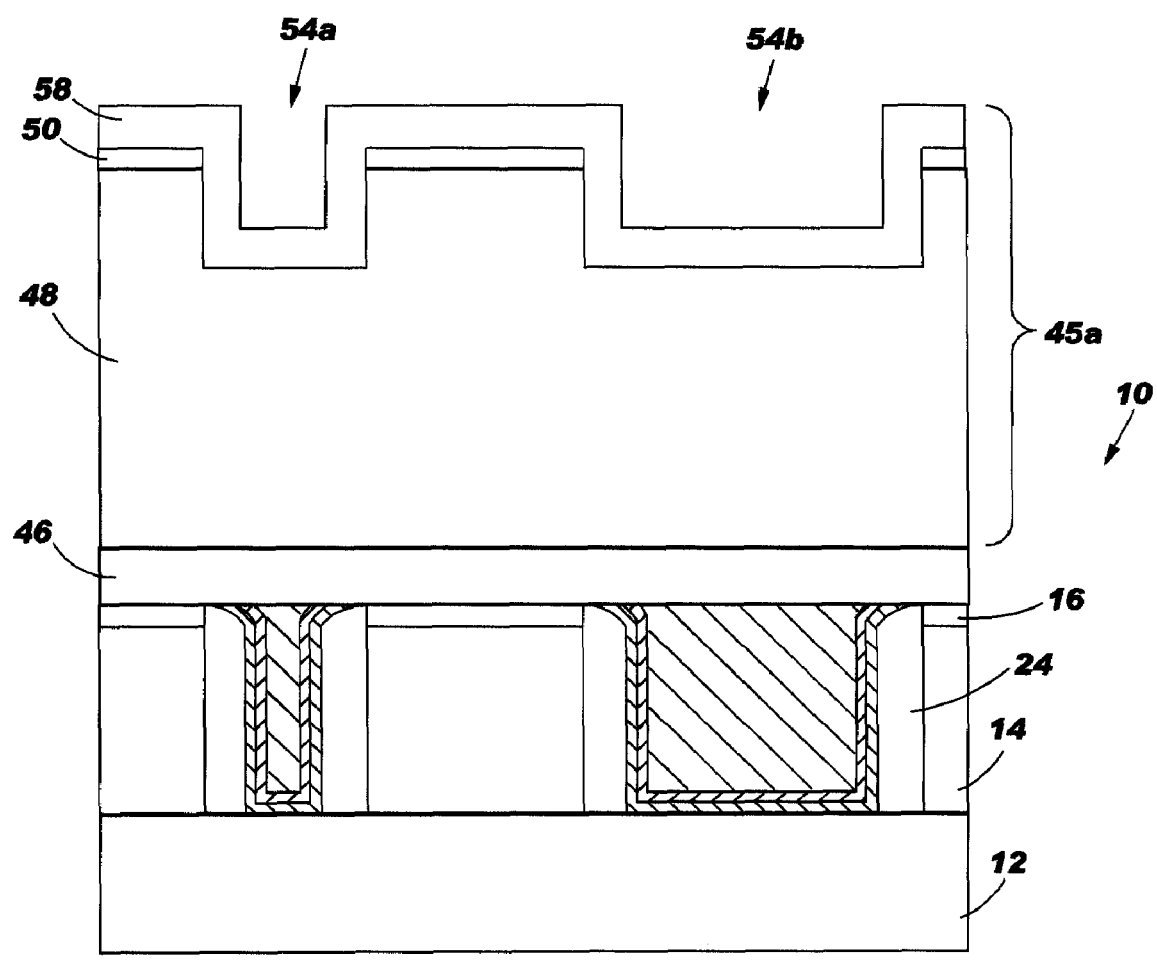
FIG. 9 depicts the device of FIG. 8 having a conformal liner thereon.

As illustrated in FIG. 9, a conformal dielectric liner 58 is deposited over the surface of the device 10. The liner 58 may comprise a dielectric material having a low dielectric constant (k), wherein "low k" is defined as a dielectric constant (k) preferably below 3.0, or in the range of approximately 1.4-4.5, such as SiCOH, SiO$_2$, poly(areylene) ether (e.g., SiLK™ (Dow Chemical)), teflon, or other similarly used material. The liner 58 may be deposited using PECVD, CVD, or other similar deposition techniques. The liner 58 may have a thickness up to approximately ½ the width of the minimum trench width 22a, and preferably ⅓ the width of the minimum trench width 22a (100-150 nm), i.e., a thickness in the range of approximately 30-50 nm.

Figure 10:
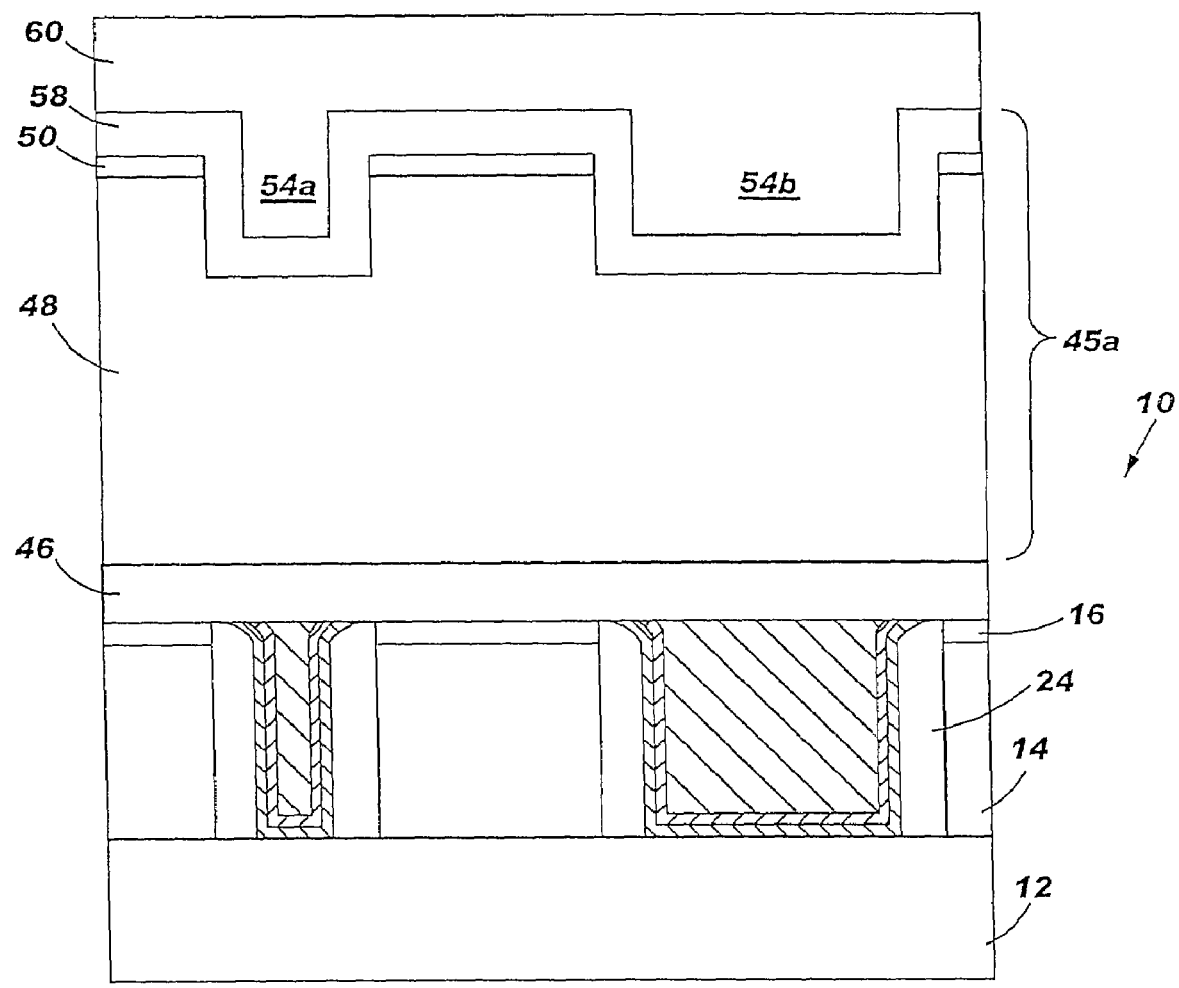
FIG. 10 depicts the device of FIG. 9 having a photoresist layer thereon.
Figure 11:
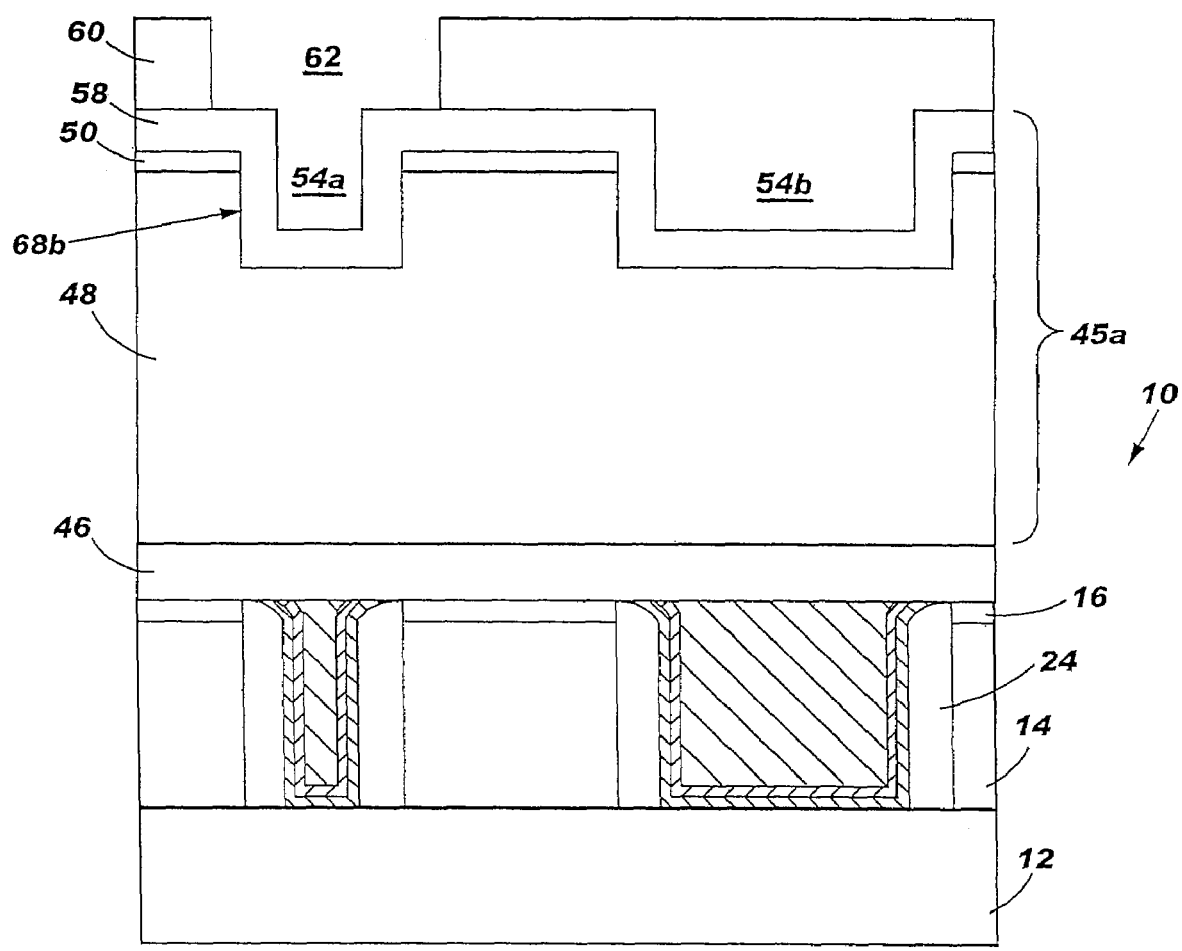
FIG. 11 depicts the device of FIG. 10 following photoresist patterning.

A photoresist layer 60 is then applied over the liner 58, as illustrated in FIG. 10. The photoresist 60 may be applied having a thickness in the range of approximately 50-3000 nm, e.g., 200 nm. The photoresist layer 60 over an optional anti-reflective layer (not shown) is then patterned using conventional positive or negative photolithography techniques, as illustrated in FIG. 11. A plurality of vias 62 may then be etched.

Figure 12:
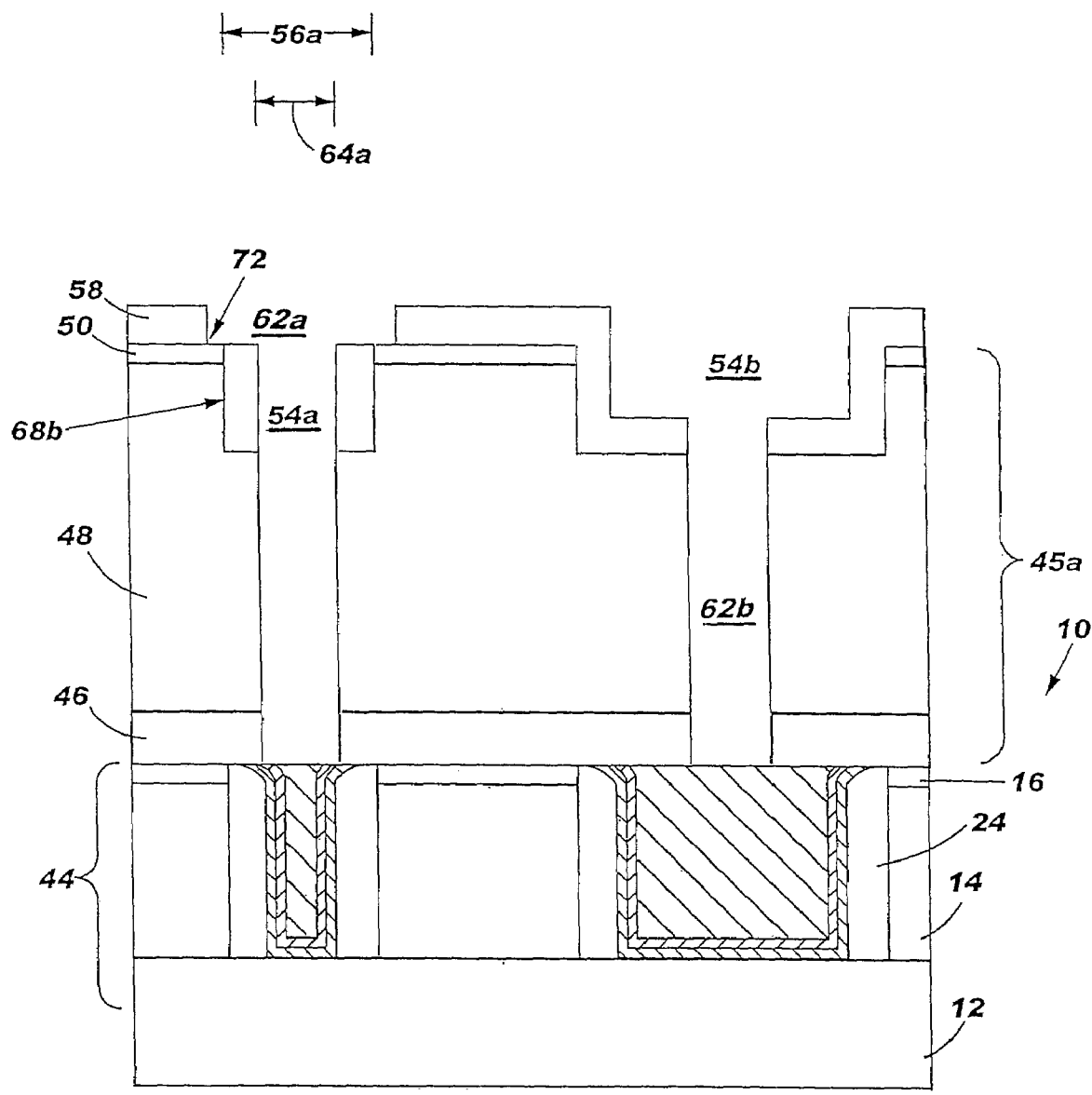
FIG. 12 depicts the device of FIG. 11 having a plurality of narrow vias formed within the trenches.
Figure 13:
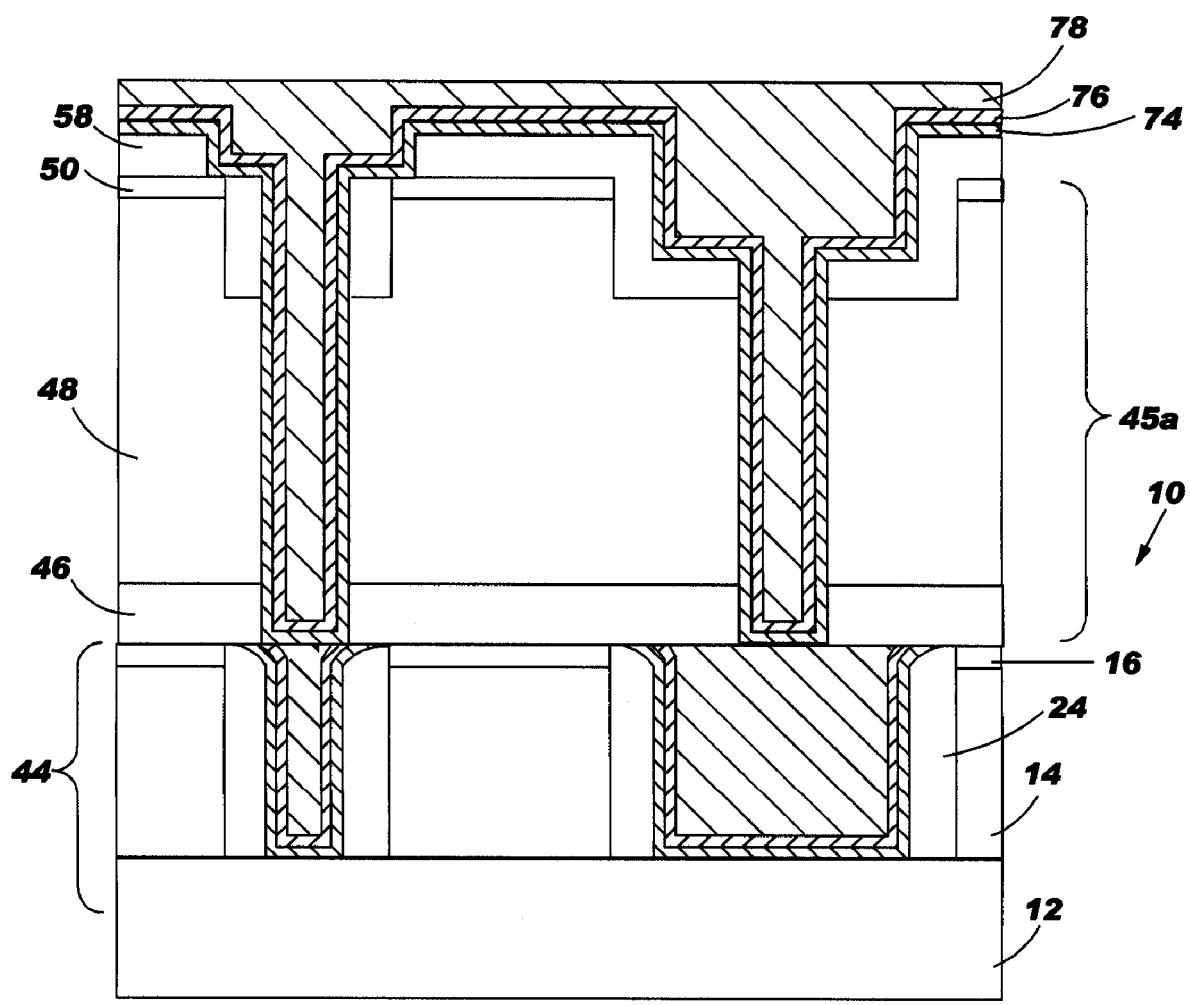
FIG. 13 depicts the device of FIG. 12 following metallization.
Figure 14:
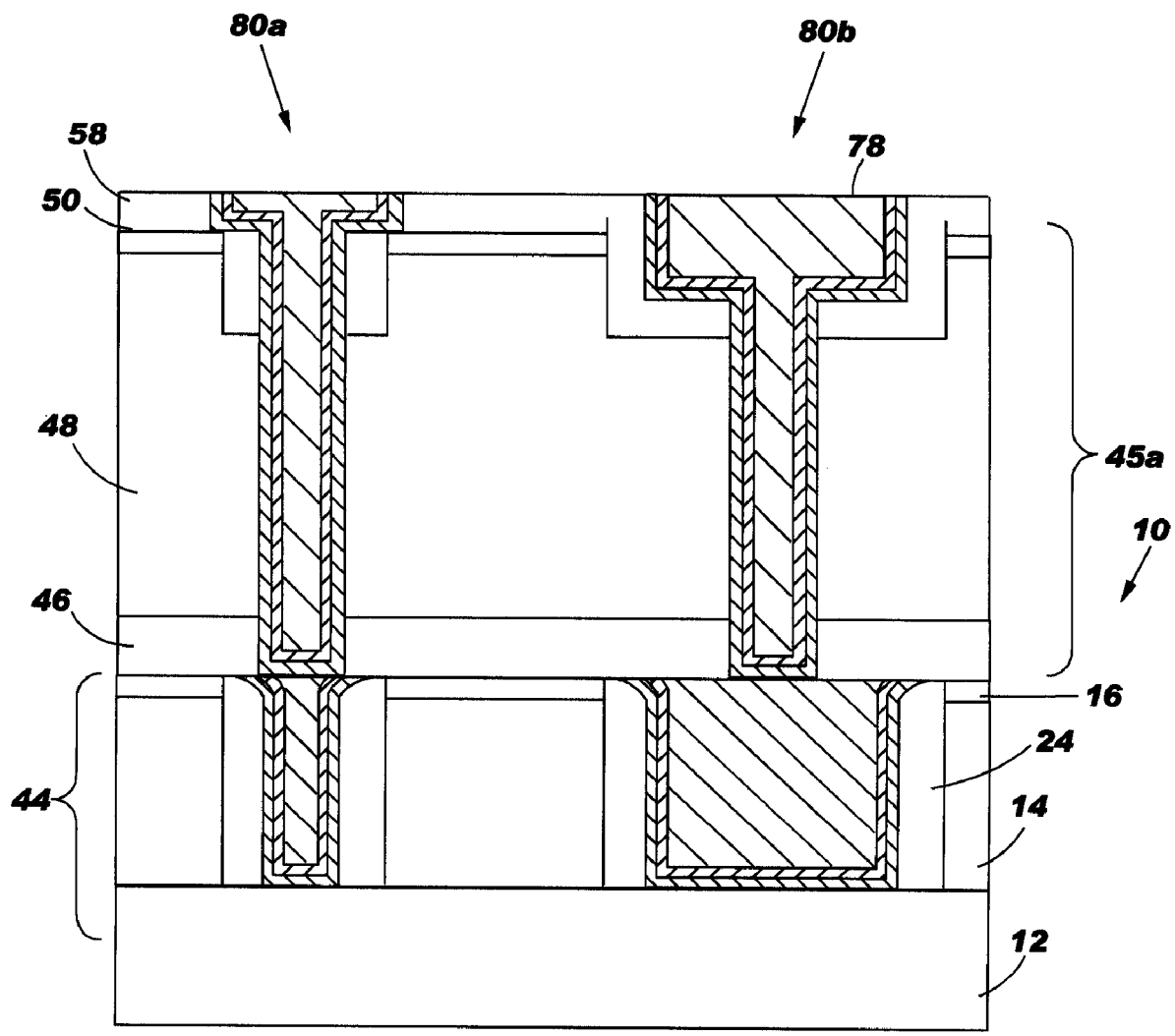
FIG. 14 depicts the device of FIG. 13 following planarization.
Figure 15:
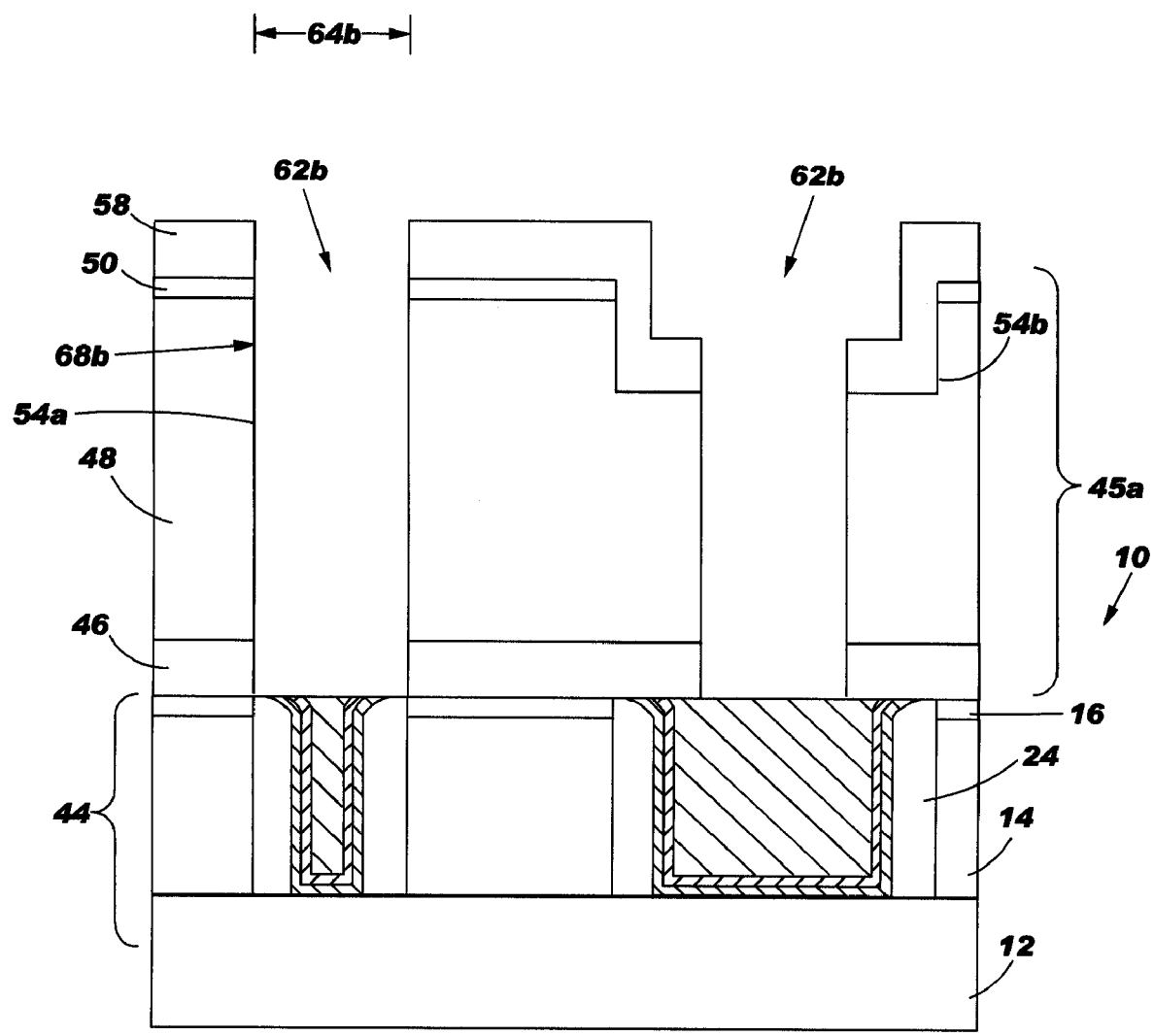
FIG. 15 depicts the device of FIG. 11 having a plurality of wide vias formed within the trenches.
Figure 16:
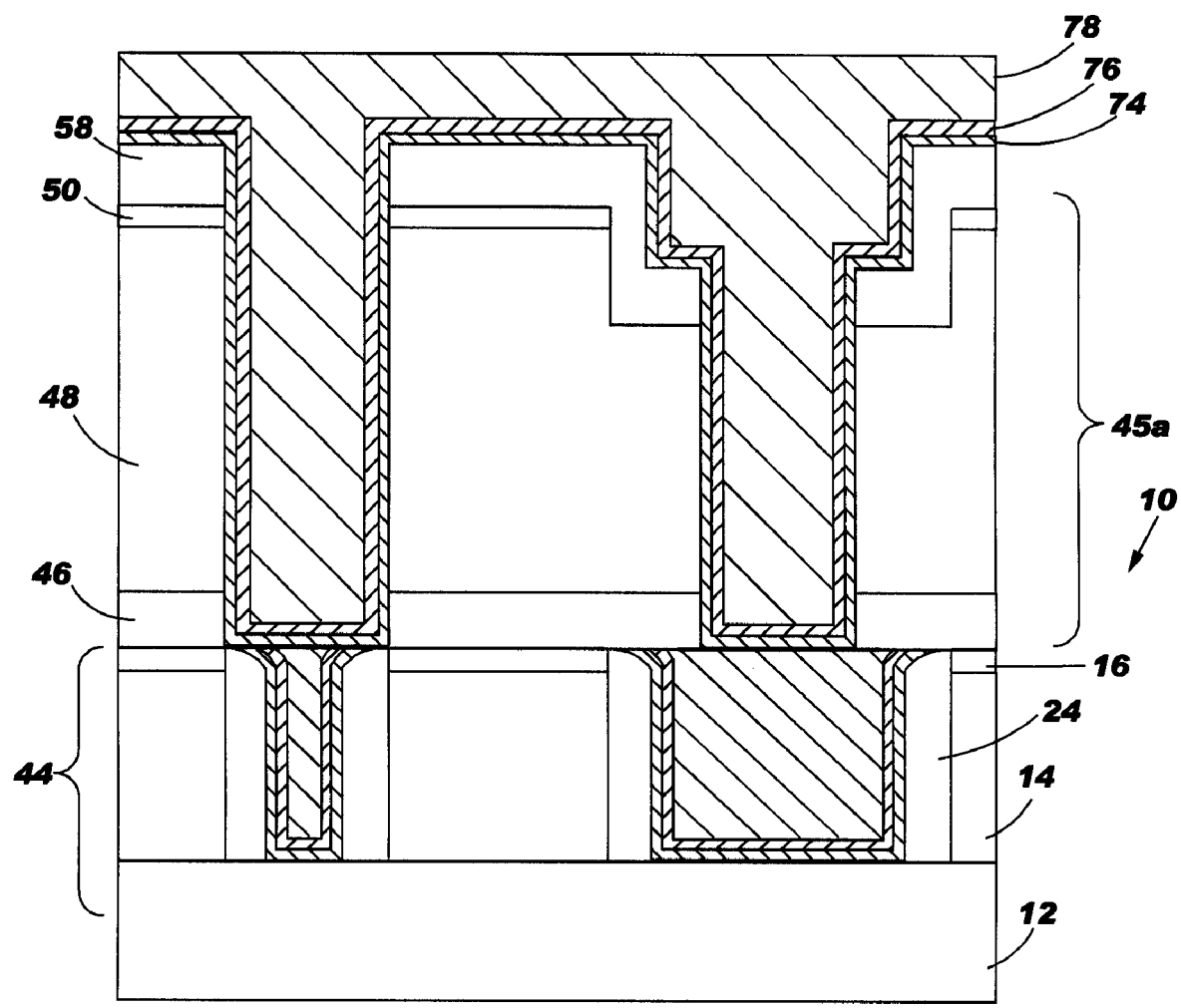
FIG. 16 depicts the device of FIG. 15 following metallization.
Figure 17:
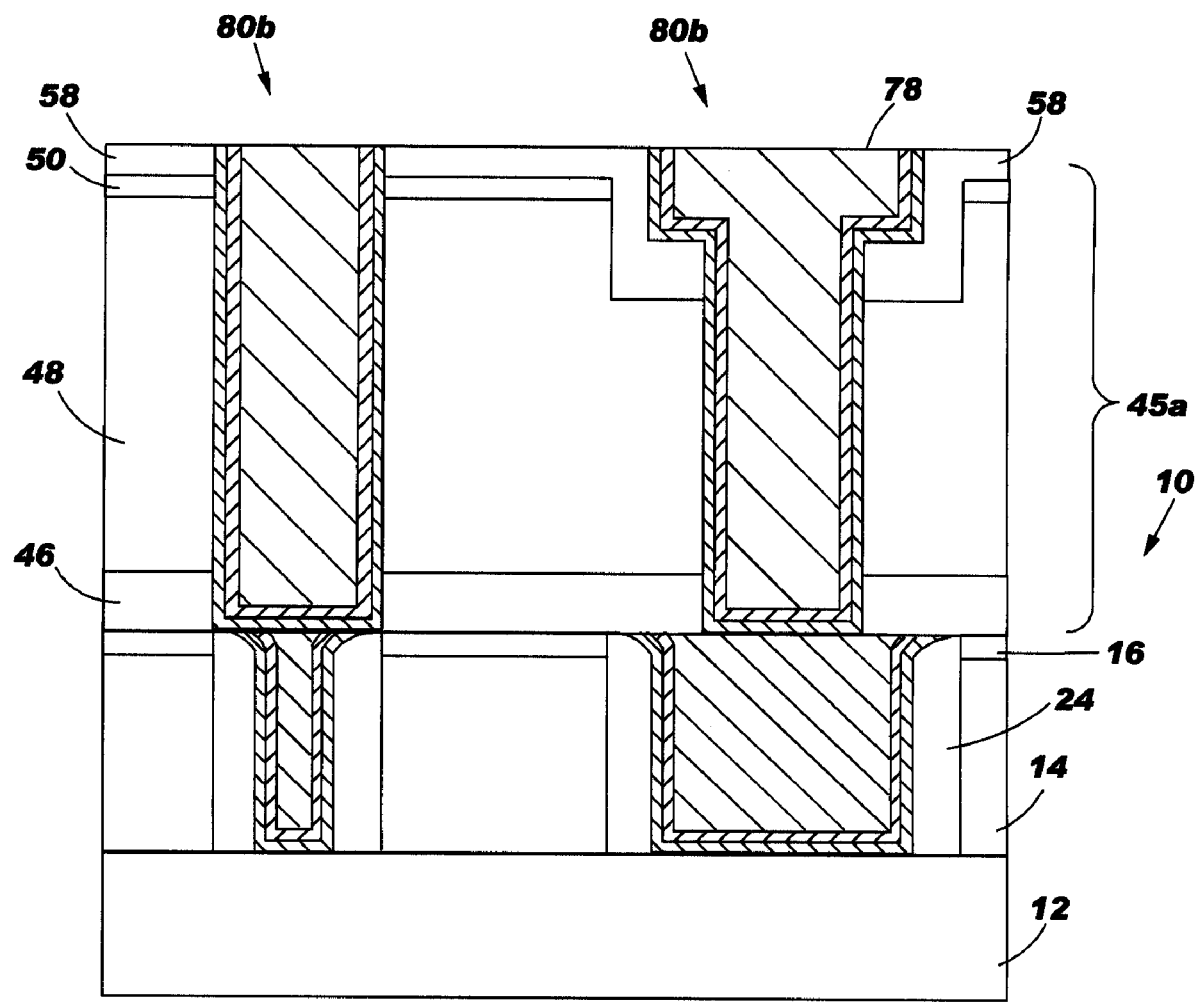
FIG. 17 depicts the device of FIG. 16 following planarization.

The vias 62 may be formed having different widths as desired. For example, as illustrated in FIGS. 12-14, narrower vias 62a may be formed having a width 64a approximately ⅓ the minimum trench width 56*a*, e.g., in the range of approximately 30-50 nm. The narrower vias 62*a* may be useful when forming devices having tighter device densities. Alternatively, wider vias 62*b* may be formed having a width 64*b* approximately the same size as the minimum trench width 56*a*), e.g., in the range of approximately 100-150 nm, as illustrated in FIGS. 15-17.

To form either vias 62*a*, 62*b*, the photoresist layer 60 is patterned, as known in the art (FIG. 11). Multiple etch chemistries are employed to then etch down through the conformal liner 58, the hard mask 50, the second dielectric layer 48, and the capping layer 46 to get down to the first wiring level 44 (FIGS. 12 and 15), using a RIE process as know in the art. The etching process may be performed until substantially all of the photoresist 60 is consumed.

As illustrated in FIG. 12, when forming the narrower vias 62*a*, the etch removes only a portion 72 of the liner 58 on the sidewalls 68*a* of the trenches 54*a* having the minimum trench width 56*a*. In contrast, when forming the wider vias 62*b*, the etch removes the conformal liner 58 on the sidewalls 68*b* of the trenches 54*a* having the minimum trench width 56*a* (FIG. 15).

Following via 62*a*, 62*b* formation, a cleaning process is performed and the metallization is deposited. As illustrated in FIGS. 13 and 16, a conductive liner 74, a seed layer 76 and a conductive layer 78 may be deposited as described supra in connection with the first wiring level 44. Again, the conductive liner 74 and the seed layer 76 are not drawn to scale for purposes of illustration.

Following deposition of the metallization, (the conductive liner 74, the seed layer 76 and the conductive layer 78), a planarization process is performed to remove the excess metallization on the surface of the second wiring level 45*a*. A CMP or other similarly used process may be used to planarize the surface of the second wiring level 45*a*. The planarization process is performed down to the conformal liner 58, as illustrated in FIGS. 14 and 17. Alternatively, the planarization process may be performed down to the hard mask 50 (not shown). Electrically conductive wires 80*a*, 80*b* are produced following planarization.

The method for forming the second wiring level 45*a*, described supra, was for a trench first, via second dual damascene feature formation. Alternatively, a second wiring level 45*b* may be formed using a via first, trench second dual damascene feature formation.

Figure 18:
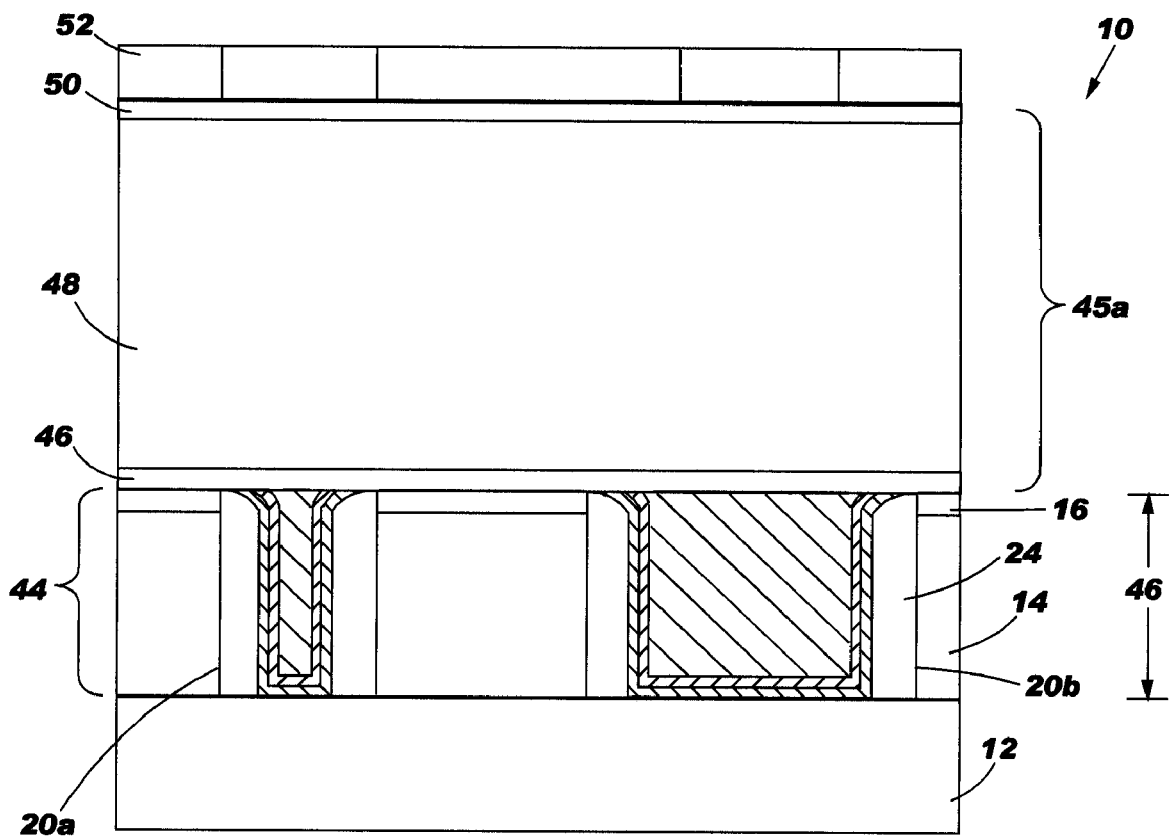
FIG. 18 depicts the device of FIG. 11 following photoresist patterning.
Figure 19:
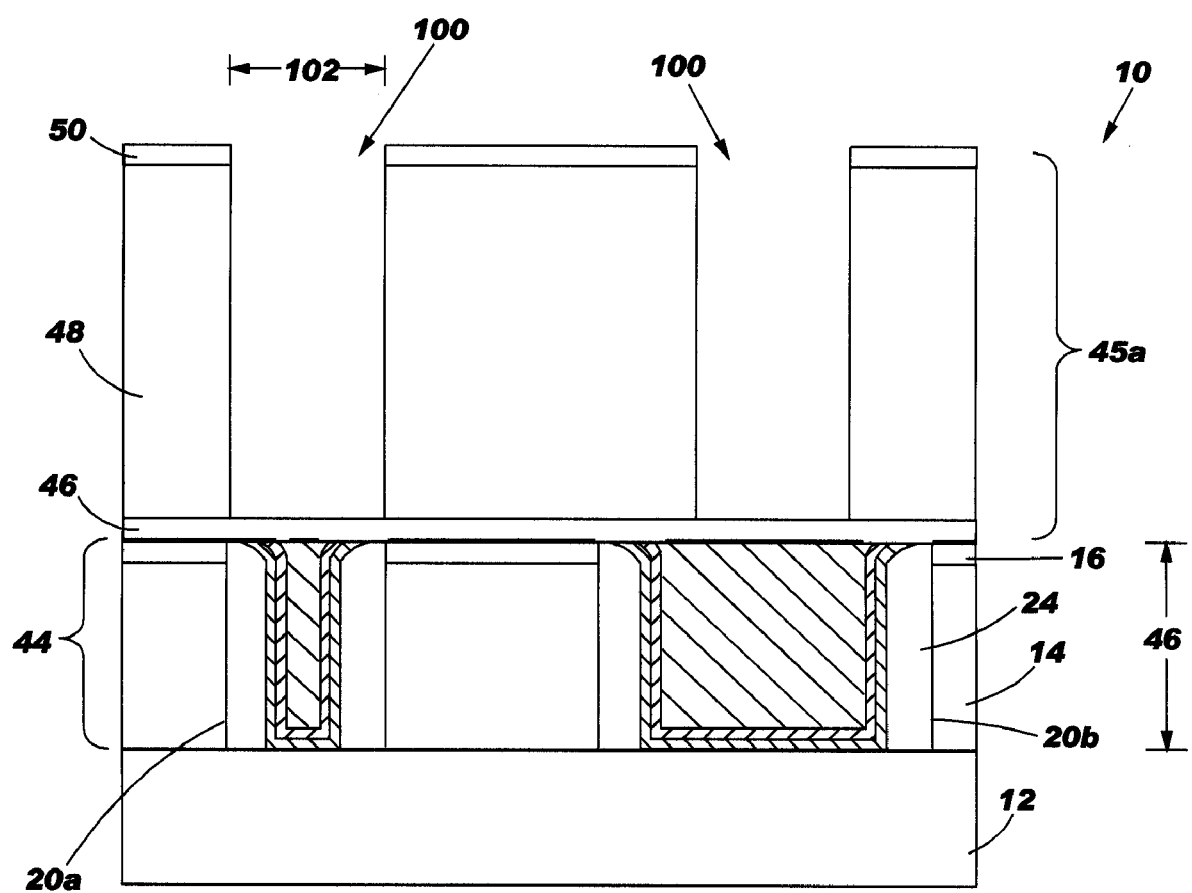
FIG. 19 depicts the device of FIG. 18 having a plurality of vias formed therein.

For example, following the formation of the device 10 illustrated in FIG. 7, as described supra, including the capping layer 46, the second dielectric layer 48, the second hard mask 50 and the photoresist layer 52, the photoresist layer 52 is patterned (FIG. 18). The second dielectric layer 48 and the hard mask 50 are then etched using standard BEOL exposure and RIE formation techniques to form vias 100, as illustrated in FIG. 19. The vias 100 may be formed having an aspect ratio of approximately 2:1, and a width 102 in the range of approximately 100-150 nm. As described supra, the photoresist 52 may be completely consumed during the standard BEOL formation processing when used in conjunction with a p-SiLK second dielectric layer 48. Alternatively, a multi-layer hard mask may be used (not shown), as described supra.

Figure 20:
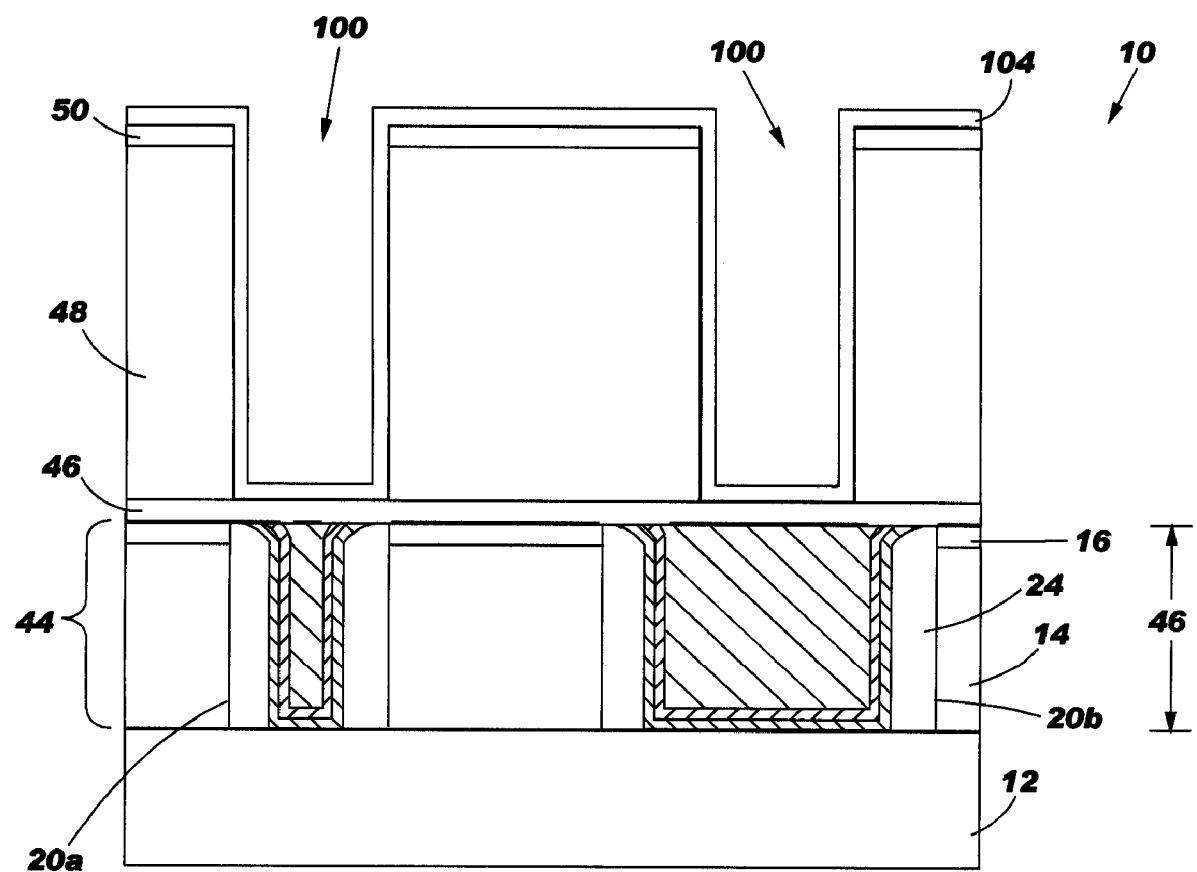
FIG. 20 depicts the device of FIG. 19 having a conformal liner deposited over the device.

As illustrated in FIG. 20, a conformal dielectric liner 104 is deposited over the surface of the device 10. The liner 104 may comprise a dielectric material having a low dielectric constant (k), wherein "low k" is defined as a dielectric constant (k) preferably below 3.0, or in the range of approximately 1.4-4.5, such as SiCOH, $SiO_2$, poly(areylene) ether (e.g., SiLK™ (Dow Chemical)), teflon, or other similarly used material. The liner 104 may be deposited using PECVD, CVD, or other similar deposition techniques. The liner 104 may have a thickness in the range of approximately 10-50 nm.

Figure 21:
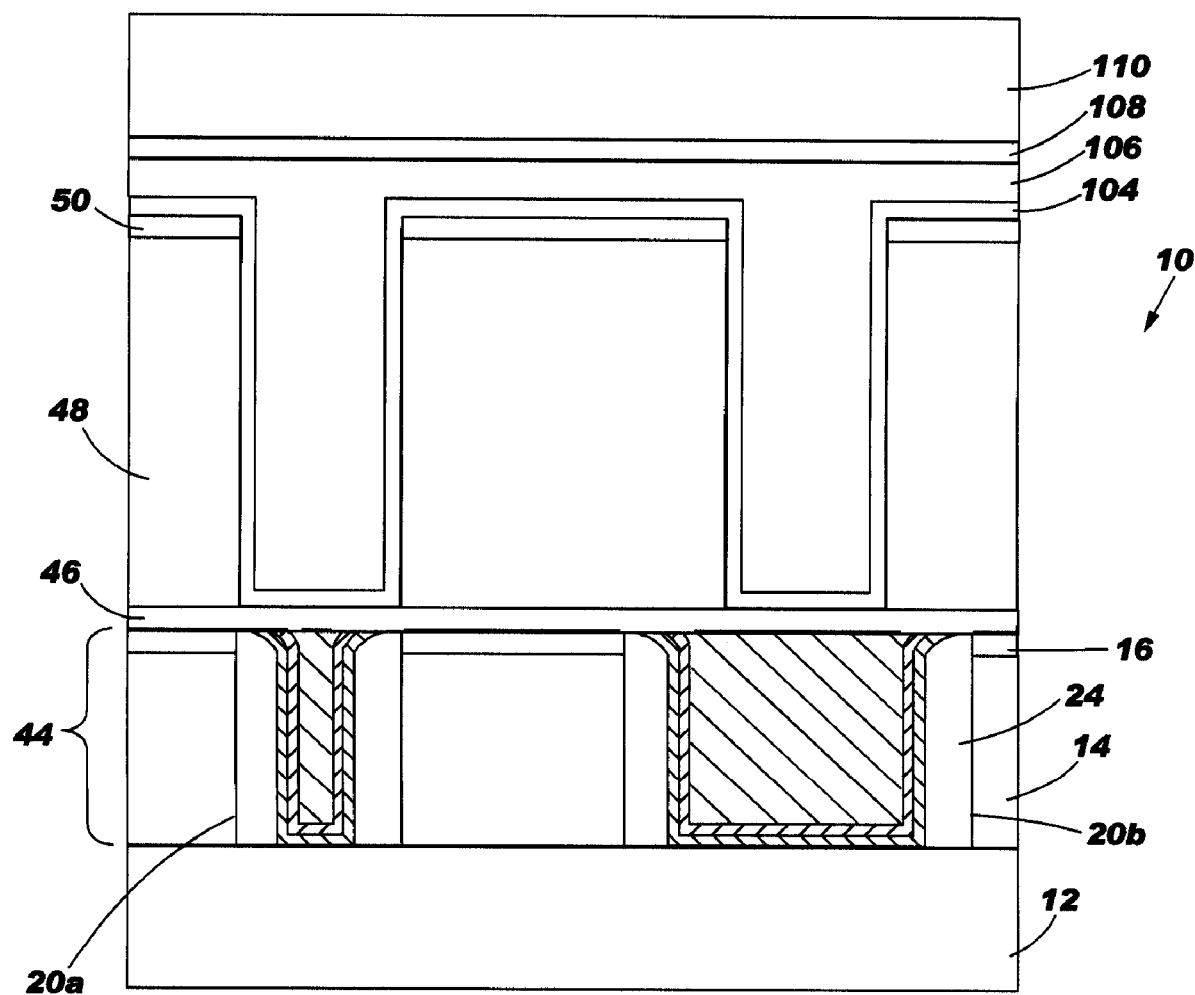
FIG. 21 depicts the device of FIG. 20 having a plurality of layers deposited over the liner.

A gap filling organic anti-reflective coating (ARC) 106 is deposited over the surface of the device 10 filling the vias 100, as illustrated in FIG. 21. The ARC 106 may be deposited having a thickness in the range of approximately 100-300 nm, e.g., 200 nm, and may comprise organic or inorganic materials, such as polymers, spin-on glass, etc. The ARC 106 may be deposited using spin-on, CVD, or other similarly used methods. The ARC 106 provides a planar surface for further processing.

A third hard mask 108 is deposited over the ARC 106 using, a low temperature oxide deposited by PECVD at approximately 200° C. (so as not to damage the ARC 106), a spin-on oxide deposition with a low temperature cure ("low temperature" meaning a temperature below approximately 300° C.), etc. The third hard mask 108 may comprise a dielectric material, such as SiC, SiCN, SiCOH, $SiO_2$, $Si_3N_4$, etc., and may be deposited to a thickness of approximately 1-100 nm, e.g., 10 nm.

Figure 22:
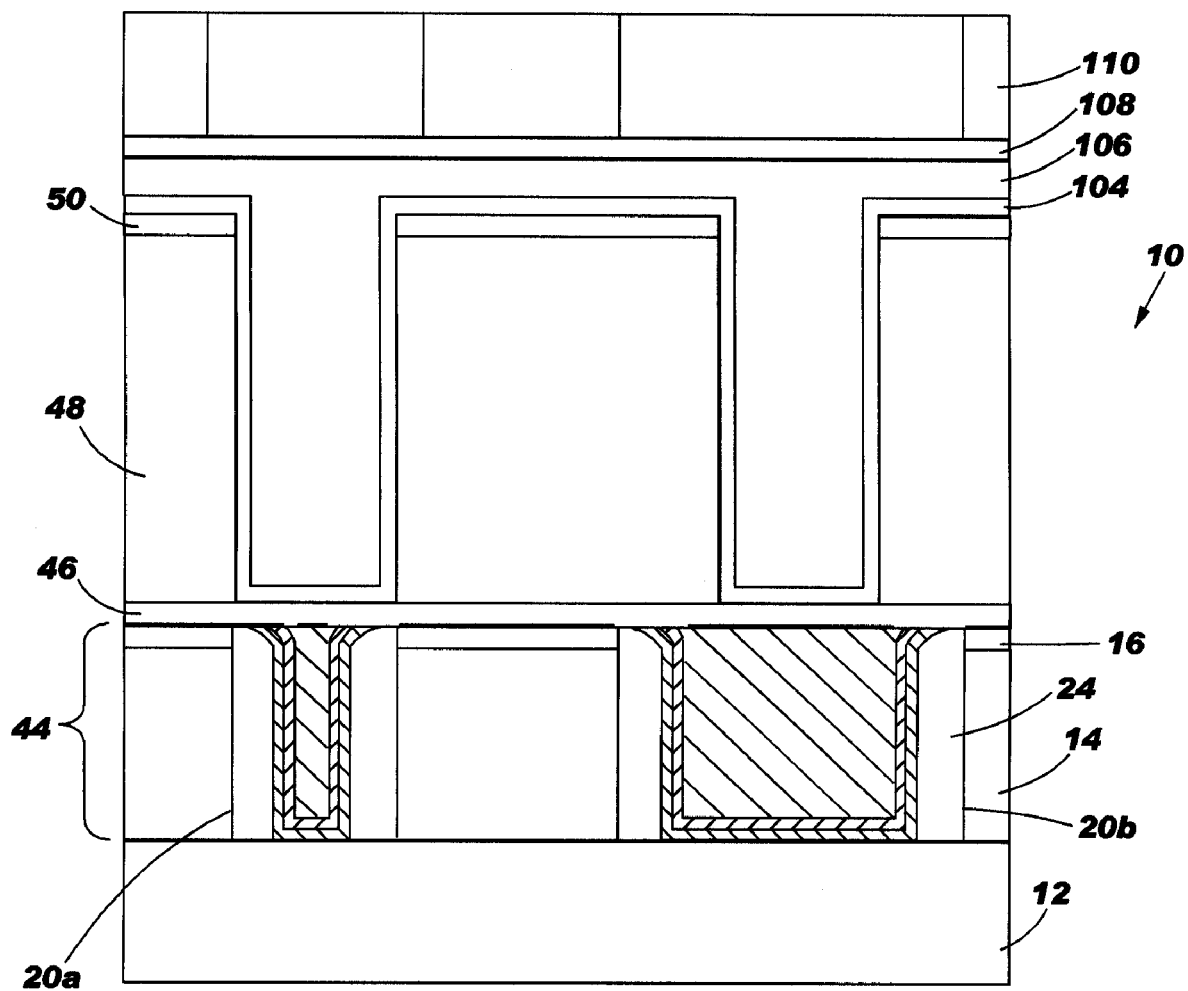
FIG. 22 depicts the device of FIG. 21 following photoresist patterning.

A photoresist layer 110 is then applied over the third hard mask 108, as illustrated in FIG. 21. The photoresist 110 may be applied having a thickness in the range of approximately 50-3000 nm, e.g., 200 nm. An optional second ARC layer (not shown) may also be deposited over the photoresist layer 110 if desired. The photoresist layer 110 is then patterned using conventional positive or negative photolithography techniques, as illustrated in FIG. 22.

Figure 23:
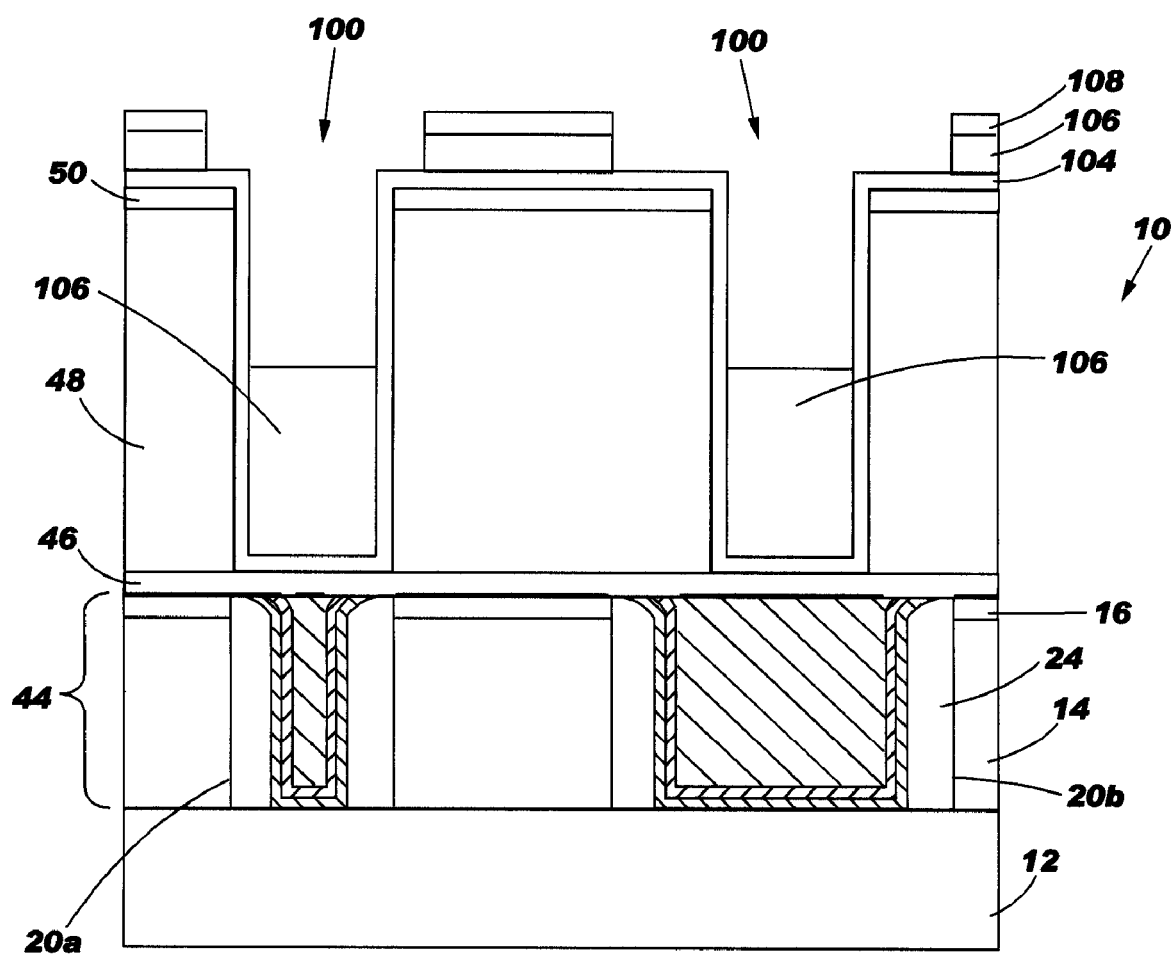
FIG. 23 depicts the device of FIG. 22 following etching.
Figure 24:
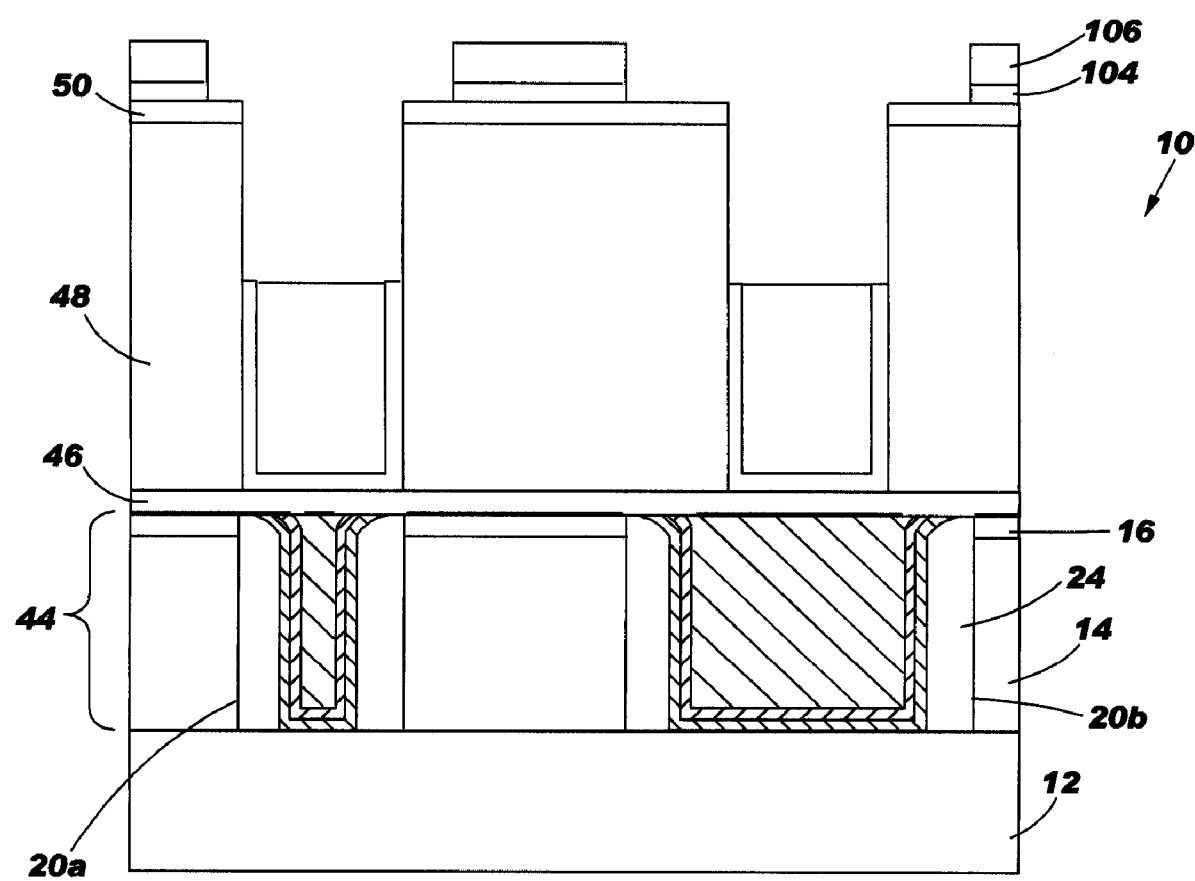
FIG. 24 depicts the device of FIG. 23 following additional etching.
Figure 25:
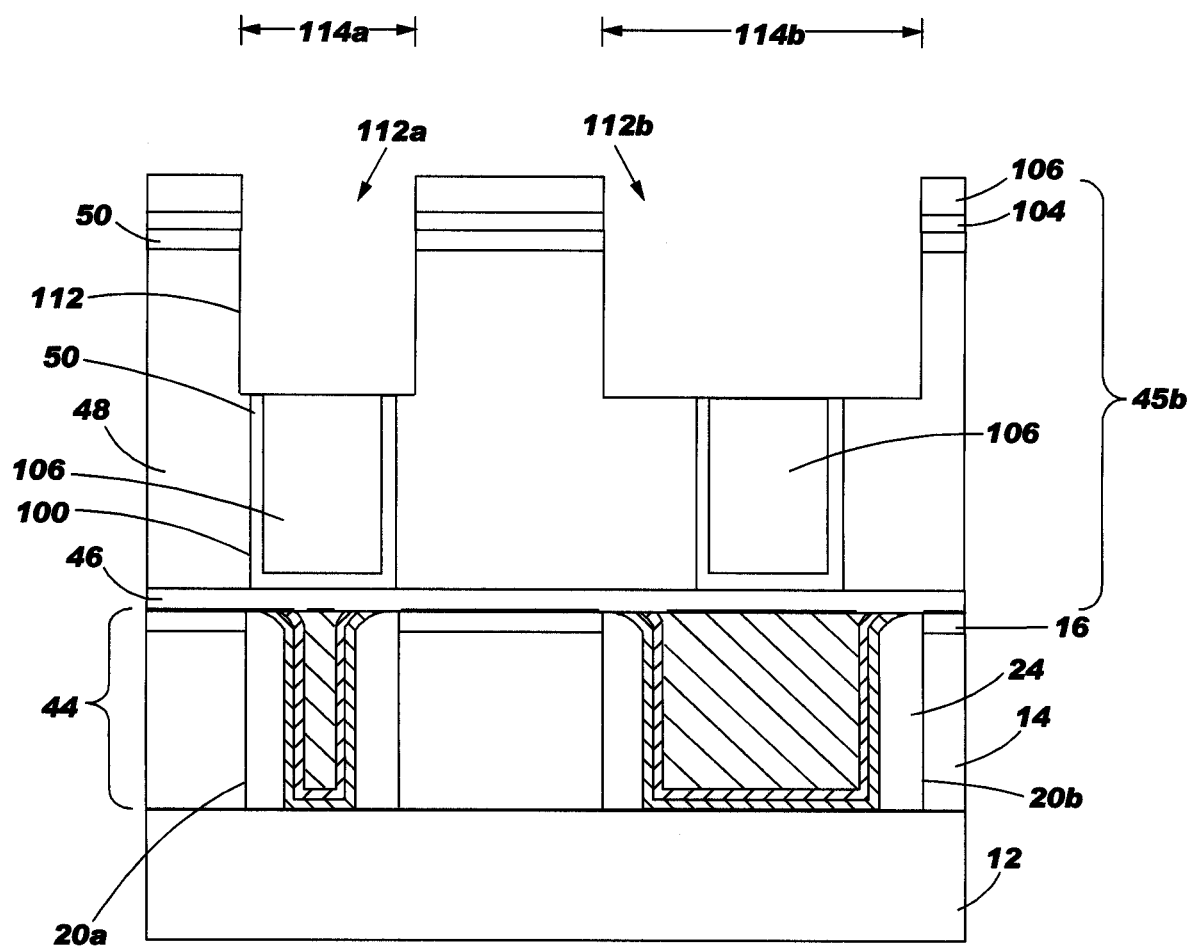
FIG. 25 depicts the device of FIG. 24 having trenches formed therein.

Various etch chemistries are used to remove portions of the third hard mask 108 and the ARC 106, as illustrated in FIG. 23. A portion of the ARC 106 remains within the vias 100 to prevent damage to the conductive material within the wires 32 of the first wiring level 44 during the subsequent etching process. A different etch chemistry is used to remove the liner 104 and the remaining hard mask 108, as illustrated in FIG. 24. Another etch chemistry is used to remove a portion of the second dielectric layer 48, thereby forming trenches 112 within the second wiring level 45*b*, as illustrated in FIG. 25. As described supra, trenches 112*a*, 112*b* having different widths 114*a*, 114*b* may be formed.

Figure 26:
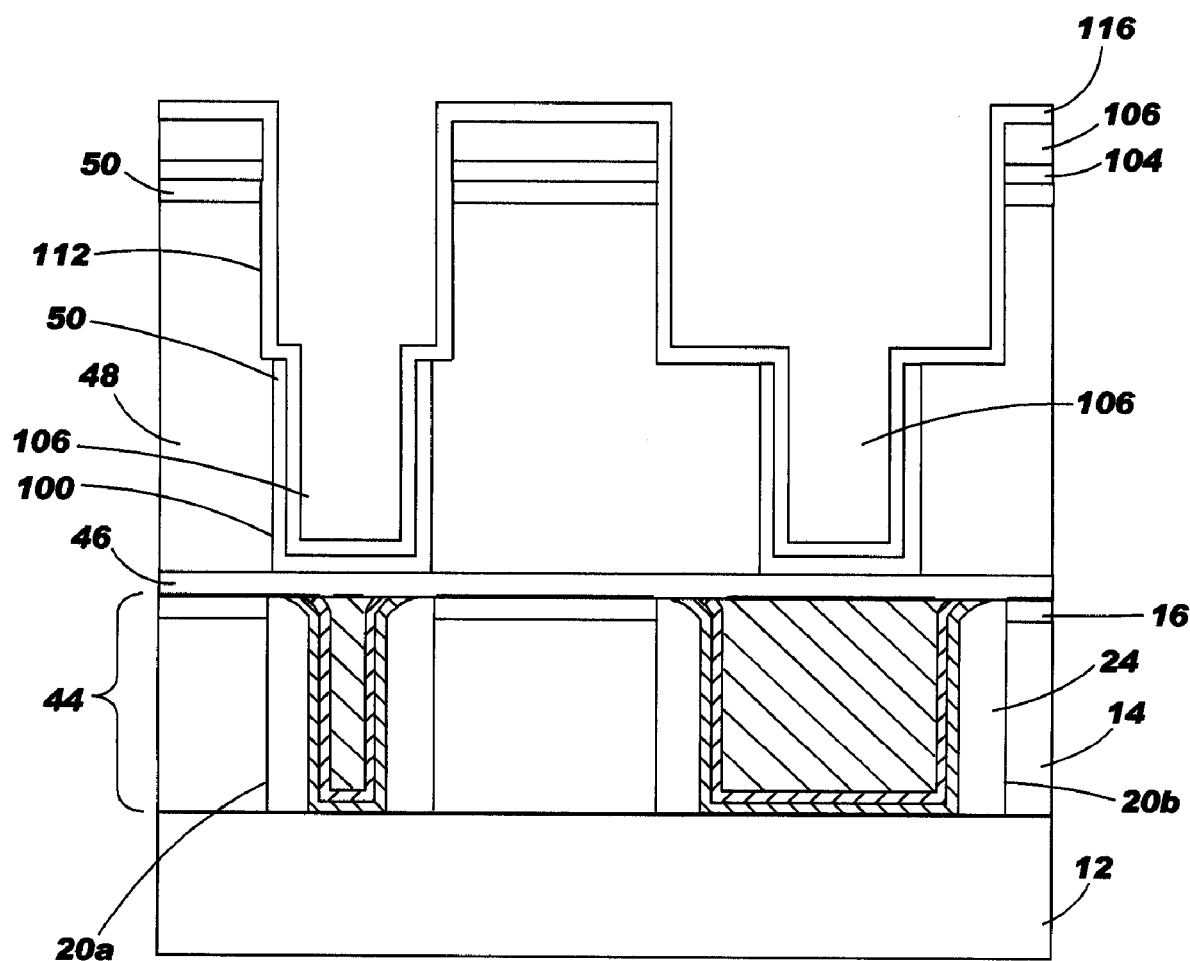
FIG. 26 depicts the device of FIG. 25 having a conformal liner deposited thereover.

As illustrated in FIG. 26, the remaining ARC 106 within the base of the vias 100 is removed using an ARC removal etch process. A conformal dielectric liner 116 is then deposited over the surface of the device 10. The liner 116 may comprise dielectric material having a low dielectric constant (k), wherein "low k" is defined as a dielectric constant (k) preferably below 3.0, or in the range of approximately 1.4-4.5, such as SiCOH, $SiO_2$, poly(areylene) ether (e.g., SiLK™ (Dow Chemical)), teflon, or other similarly used material. The liner 116 may be deposited using PECVD, CVD, or other similar deposition techniques. The liner 116 may have a thickness up to approximately ½ the width of the minimum trench width 114*a*, and preferably ⅓ the width of the minimum trench width 114*a* (100-150 nm), i.e., a thickness in the range of approximately 30-50 nm.

Figure 27:
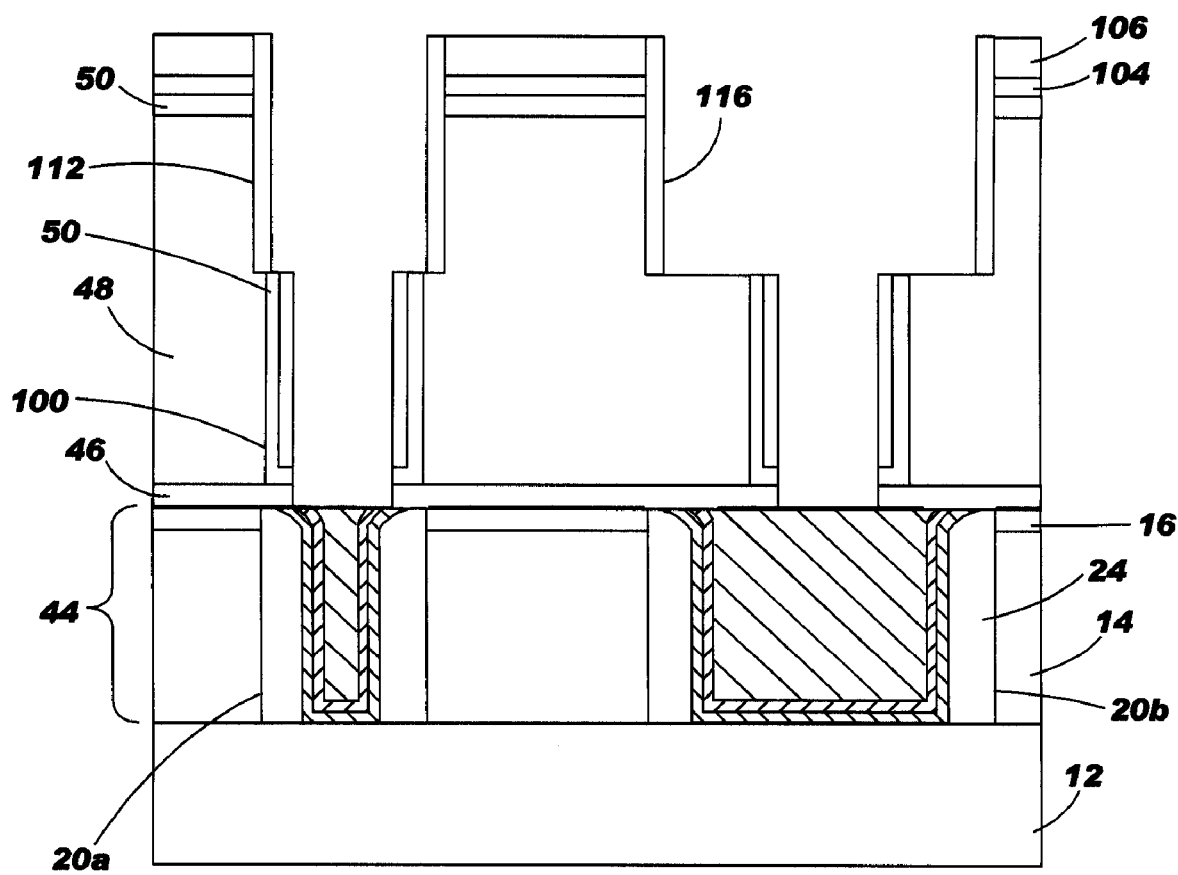
FIG. 27 depicts the device of FIG. 26 following etching.

Multiple etch chemistries are employed to then etch down through the conformal liners 116, 50 and the capping layer 46 within the base of the vias 100 to get down to the first wiring level 44, as illustrated in FIG. 27.

Figure 28:
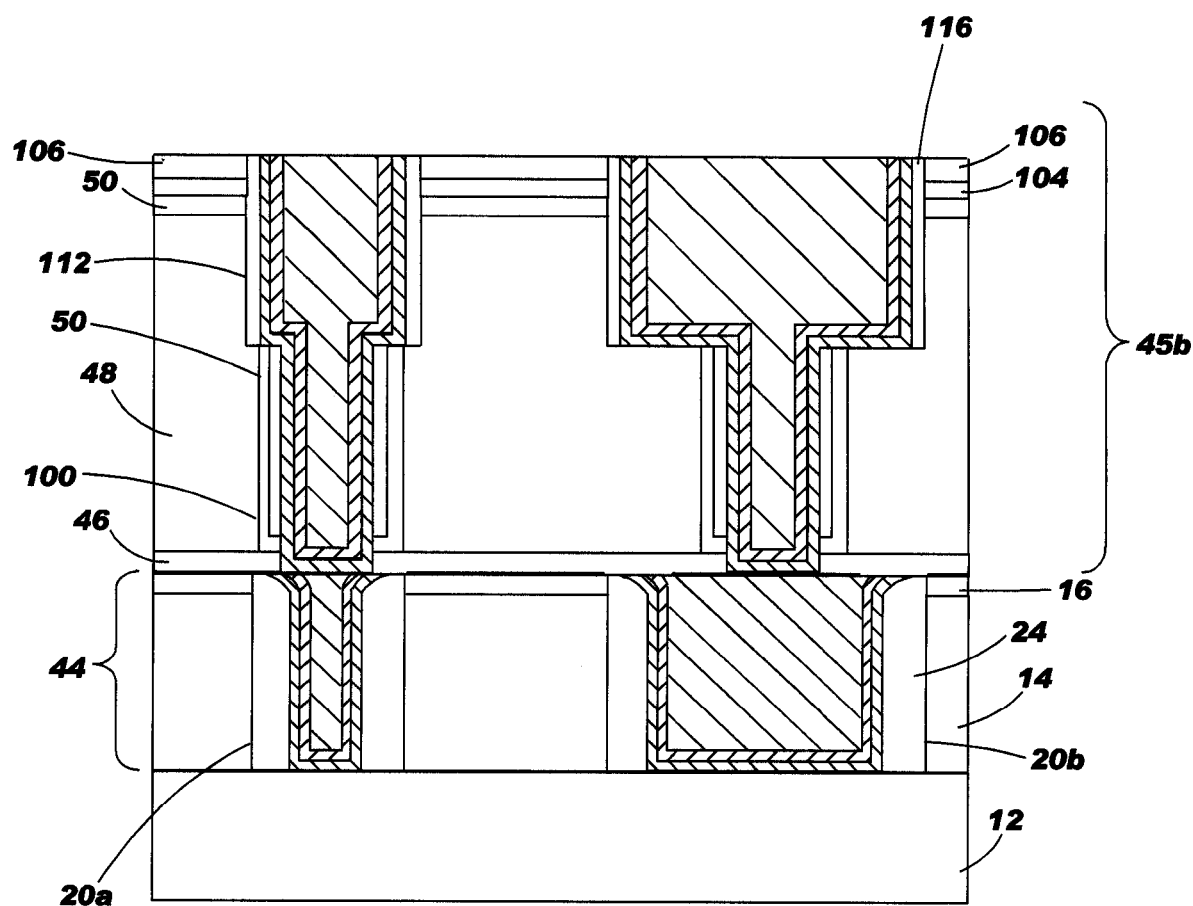
FIG. 28 depicts the device of FIG. 27 following metallization.

A cleaning process is then performed and the metallization is deposited, as described supra. As illustrated in FIG. 28, a conductive liner 120, a seed layer 122 and a conductive layer 124 may be deposited as described supra in connection with the first wiring level 44. Again, the conductive liner 120 and the seed layer 122 are not drawn to scale for purposes of illustration.

Figure 29:
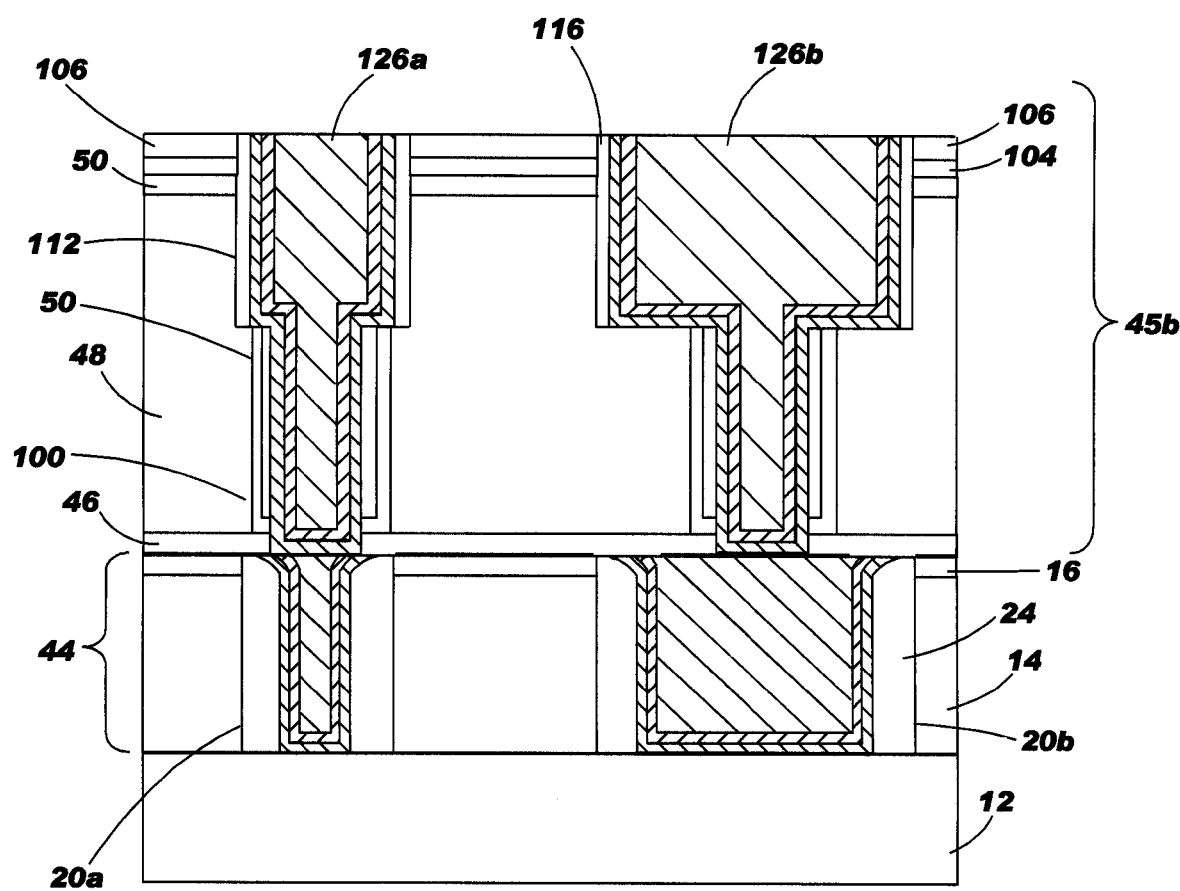
FIG. 29 depicts the device of FIG. 28 following planarization.

Following deposition of the metallization, (the conductive liner 120, the seed layer 122 and the conductive layer 124), a planarization process is performed to remove the excess metallization on the surface of the second wiring level 45b, as illustrated in FIG. 29. A CMP or other similarly used process may be used to planarize the surface of the second wiring level 45b. Electrically conductive dual damascene wires 126a, 126b are produced following planarization.

What is claimed is:

1. A method of forming a semiconductor device, comprising:
   providing a substrate;
   depositing a first dielectric layer on the substrate, wherein the first dielectric layer comprises a material having a dielectric constant in a range of 1.4 to 2.7;
   depositing a first hard mask on the first dielectric layer;
   forming an at least one first feature within the first dielectric layer and the first hard mask;
   depositing a first conformal liner over a top surface of the first hard mask and within the at least one first feature, wherein the first conformal liner occupies more than at least 2% of a volume of the at least one first feature;
   removing a portion of the first conformal liner that was deposited over the top surface of the first hard mask and within the at least one feature, wherein the first conformal liner that remains after said removing said portion of the first conformal liner is performed is not on the top surface of the first hard mask and is in direct physical contact with the substrate, the first dielectric layer, and the first hard mask;
   depositing a first conductive material over the first conformal liner;
   planarizing a surface of the device to remove excess first conductive material;
   depositing a capping layer over the surface of the first conductive material following planarizing the surface of the device;
   depositing a second dielectric layer on the capping layer, wherein the second dielectric layer comprises a low k dielectric material;
   depositing a second hard mask on the second dielectric layer;
   forming an at least one second feature within the second dielectric layer and the second hard mask;
   depositing a second conformal liner over the second hard mask and within the at least one second feature, wherein the second conformal liner occupies at least 50% of a volume of the at least one second feature;
   depositing a second conductive material over the second conformal liner; and
   planarizing a surface of the device to remove excess second conductive material which results in a planar surface of the first conductive material and a planar surface of the second conductive material,
   wherein the first conductive material and the second conductive material comprise copper, and wherein the capping layer comprises a continuously distributed capping material that prevents diffusion of copper from the first conductive material in the at least one first feature to the second dielectric layer and from the second conductive material in the at least one second feature to the second dielectric layer,
   wherein one feature of the at least one first feature is denoted as feature A, wherein one feature of the at least one second feature is denoted as feature B, and wherein the continuously distributed capping material is in direct mechanical contact with:
   the planar surface of the first conductive material in feature A and the planar surface of the second conductive material in feature B,
   a first portion of the first hard mask that is external to feature A,
   a second portion of the first hard mask that is external to feature B,
   a third portion of the first hard mask that is disposed between feature A and feature B and is further disposed between the first portion of the first hard mask and the second portion of the first hard mask, and
   the first conformal liner in both feature A and feature B.

2. The method of claim 1, wherein the first dielectric layer comprises a material having a low dielectric constant, wherein the material is selected from the group consisting of: porous poly(areylene) ether, porous SiCOH, porous $SiO_2$, teflon and amorphous carbon.

3. The method of claim 1, wherein the first hard mask comprises a material selected from the group consisting of: SiC, SiCN, SiCOH, $SiO_2$, and $Si_3N_4$.

4. The method of claim 1, wherein the first conformal liner comprises a dielectric material having a low dielectric constant, wherein the material is selected from the group consisting of: SiCOH, $SiO_2$, poly(areylene) ether and teflon.

5. The method of claim 1, wherein depositing the first conductive material further comprises:
   depositing a conductive liner over the first conformal liner;
   depositing a seed layer over the conductive liner; and
   depositing a conductive layer over the seed layer.

6. The method of claim 1, wherein the first feature comprises a single damascene feature or a dual damascene feature.

7. The method of claim 1, wherein a thickness of the first conformal liner is approximately 30-50 nm.

8. The method of claim 1, wherein said depositing the first conformal liner comprises:
   conformally depositing a first liner on the first hard mask and in the first trench such that a first portion of the first liner is on the first hard mask, a second portion of the first liner is on sidewalls of both the first trench, and a third portion of the first liner is on a bottom wall of the first trench; and
   removing the first portion and the third portion of the first liner such that the second portion of the first liner remains, said first conformal liner being the remaining second portion of the first liner.

9. A method of forming a semiconductor device, comprising:
   providing a substrate;
   depositing a first dielectric layer on and in direct mechanical contact with a top surface of the substrate, wherein the first dielectric layer comprises a material having a dielectric constant in a range of 1.4 to 2.7;
   depositing a first hard mask on the first dielectric layer;
   forming a first trench and a second trench within the first dielectric layer and the first hard mask, wherein the second trench is wider than the first trench in a first direction that is parallel to the top surface of the substrate;
   depositing a first conformal liner over a top surface of the first hard mask and within both the first trench and the second trench;

removing a portion of the first conformal liner that was deposited over the top surface of the first hard mask and within both the first trench and the second trench, wherein the first conformal liner that remains after said removing said portion of the first conformal liner is performed is not on the top surface of the first hard mask and is in direct physical contact with the top surface of the substrate, the first dielectric layer, and the first hard mask;

depositing a first conductive material over the first conformal liner to fill the first and second trenches and extend above the first and second trenches;

planarizing the first conductive material to remove an excess of the first conductive material that extend above the first and second trenches, resulting in formation of a planar surface of the first conductive material, wherein the planar surface of the first conductive material is parallel to the first direction;

depositing a capping layer on, and in direct mechanical contact with, the planar surface of the first conductive material, the top surface of the first hard mask, and the first conformal liner;

forming a second dielectric layer on, and in direct mechanical contact with, the capping layer; and depositing a second hard mask on, and in direct mechanical contact with, the second dielectric layer.

10. The method of claim 9, wherein the first conductive material comprises copper;

wherein the capping layer comprises a continuously distributed capping material that prevents diffusion of copper from the first conductive material in both the first trench and the second trench to the second dielectric layer.

11. The method of claim 10, wherein the method further comprises:

forming a third trench and a fourth trench though the second hard mask and in the second dielectric layer, wherein the third and fourth trenches are respectively aligned directly above the first and second trenches, and wherein the fourth trench is wider than the third trench in the first direction; and forming a conformal dielectric liner in the third and fourth trenches and on a top surface of the second hard mask and in direct mechanical contact with the second hard mask, wherein the conformal dielectric liner comprises a low dielectric constant (low k) dielectric material having a dielectric constant in a range of 1.4 to 4.5.

12. The method of claim 11, wherein the method further comprises:

forming a photoresist layer that fills the third and fourth trenches and extends above the third and fourth trenches and the conformal dielectric liner; and removing a first portion of the photoresist layer that has filled the third trench and removing a second portion of the photoresist layer that extends above the third trench to form a fifth trench above the third trench, wherein a remaining portion of the photoresist layer remains, wherein the fifth trench is contiguous with the third trench, and wherein the fifth trench is wider than the third trench in the first direction.

13. The method of claim 12, wherein the method further comprises forming an anti-reflective layer on the conformal dielectric liner, wherein said forming the photoresist layer comprises forming the photoresist layer over the anti-reflective layer.

14. The method of claim 12, wherein the method further comprises:

removing the remaining portion of the photoresist layer and a first portion of the conformal dielectric liner, leaving a remaining portion of the conformal dielectric liner resulting in removal of the fifth trench and formation of sixth trench that that replaces a portion of the third trench and is bounded by the remaining portion of the conformal dielectric liner;

extending the third trench through the conformal dielectric layer, the second dielectric layer, and the capping layer; and forming a seventh trench through the conformal dielectric layer, the second dielectric layer and the capping layer, wherein the seventh trench is contiguous with the fourth trench, and wherein the fourth trench is wider than the seventh trench in the first direction.

15. The method of claim 14, wherein the method further comprises:

depositing a conductive layer to fill the sixth, third, fourth, and seventh trenches such that the conductive layer extends above the sixth and fourth trenches; and planarizing the conductive layer to remove an excess of the conductive layer that extends above the sixth and fourth trenches, resulting in formation of a planar surface of the conductive layer, wherein the planar surface of the conductive layer is parallel to the first direction.

16. The method of claim 9, wherein said depositing the first conformal liner comprises:

conformally depositing a first liner on the first hard mask and in the both first trench and the second trench such that a first portion of the first liner is on the first hard mask, a second portion of the first liner is on sidewalls of both the first trench and the second trench, and a third portion of the first liner is on a bottom wall of both the first trench and the second trench; and removing the first portion and the third portion of the first liner such that the second portion of the first liner remains, said first conformal liner being the remaining second portion of the first liner.

17. The method of claim 10, wherein the continuously distributed capping material is in direct mechanical contact with:

the planar surface of the first conductive material in both the first trench and the second trench, a first portion of the first hard mask that is external to the first trench, a second portion of the first hard mask that is external to the second trench, a third portion of the first hard mask that is disposed between the first trench and the second trench and is further disposed between the first portion of the first hard mask and the second portion of the first hard mask, and the first conformal liner in both the first trench and the second trench.

18. A method of forming a semiconductor device, comprising:

providing a substrate;

depositing a first dielectric layer on and in direct mechanical contact with a top surface of the substrate, wherein the first dielectric layer comprises a material having a dielectric constant in a range of 1.4 to 2.7;

depositing a first hard mask on the first dielectric layer, wherein the first hard mask comprises a first lower hard mask layer that includes SiC and a second upper hard mask layer that includes SiO$_2$;

forming a first trench and a second trench within the first dielectric layer and the first hard mask, wherein the second trench is wider than the first trench in a first direction that is parallel to the top surface of the substrate;

depositing a first conformal liner over a top surface of the first hard mask and within both the first trench and the second trench;

removing a portion of the first conformal liner that was deposited over the top surface of the first hard mask and within both the first trench and the second trench, wherein the first conformal liner that remains after said removing said portion of the first conformal liner is performed is not on the top surface of the first hard mask and is in direct physical contact with the top surface of the substrate, the first dielectric layer, and the first hard mask;

depositing a first conductive material over the first conformal liner to fill the first and second trenches and extend above the first and second trenches, wherein the first conductive material comprises copper;

planarizing the first conductive material to remove an excess of the first conductive material that extend above the first and second trenches, resulting in formation of a planar surface of the first conductive material, wherein the planar surface of the first conductive material is parallel to the first direction;

depositing a capping layer on, and in direct mechanical contact with, the planar surface of the first conductive material, the top surface of the first hard mask, and the first conformal liner;

forming a second dielectric layer on, and in direct mechanical contact with, the capping layer, wherein the capping layer comprises a continuously distributed capping material that prevents diffusion of copper from the first conductive material in both the first trench and the second trench to the second dielectric layer;

depositing a second hard mask on, and in direct mechanical contact with, the second dielectric layer;

forming a third trench and a fourth trench though the second hard mask and in the second dielectric layer, wherein the third and fourth trenches are respectively aligned directly above the first and second trenches, and wherein the fourth trench is wider than the third trench in the first direction;

forming a conformal dielectric liner in the third and fourth trenches and on a top surface of the second hard mask and in direct mechanical contact with the second hard mask, wherein the conformal dielectric liner comprises a low dielectric constant (low k) dielectric material having a dielectric constant in a range of 1.4 to 4.5;

forming a photoresist layer that fills the third and fourth trenches and extends above the third and fourth trenches and the conformal dielectric liner;

removing a first portion of the photoresist layer that has filled the third trench and removing a second portion of the photoresist layer that extends above the third trench to form a fifth trench above the third trench, wherein a remaining portion of the photoresist layer remains, wherein the fifth trench is contiguous with the third trench, and wherein the fifth trench is wider than the third trench in the first direction;

removing the remaining portion of the photoresist layer and a first portion of the conformal dielectric liner, leaving a remaining portion of the conformal dielectric liner resulting in removal of the fifth trench and formation of sixth trench that replaces a portion of the third trench and is bounded by the remaining portion of the conformal dielectric liner;

extending the third trench through the conformal dielectric layer, the second dielectric layer, and the capping layer;

forming a seventh trench through the conformal dielectric layer, the second dielectric layer, and the capping layer, wherein the seventh trench is contiguous with the fourth trench, and wherein the fourth trench is wider than the seventh trench in the first direction;

depositing a conductive layer to fill the sixth, third, fourth, and seventh trenches such that the conductive layer extends above the sixth and fourth trenches; and planarizing the conductive layer to remove an excess of the conductive layer that extends above the sixth and fourth trenches, resulting in formation of a planar surface of the conductive layer, wherein the planar surface of the conductive layer is parallel to the first direction.

* * * * *